US010355489B2

(12) United States Patent
McNamara et al.

(10) Patent No.: US 10,355,489 B2
(45) Date of Patent: Jul. 16, 2019

(54) SYSTEM AND METHOD FOR MANAGING THE POWER OUTPUT OF A PHOTOVOLTAIC CELL

(71) Applicant: Solarlytics, Inc., Livermore, CA (US)

(72) Inventors: Robert P. McNamara, San Jose, CA (US); Douglas M. Raymond, Livermore, CA (US)

(73) Assignee: Solarlytics, Inc., Livermore, CA (US)

( * ) Notice: Subject to any disclaimer, the term of this patent is extended or adjusted under 35 U.S.C. 154(b) by 0 days.

(21) Appl. No.: 16/042,758

(22) Filed: Jul. 23, 2018

(65) Prior Publication Data

US 2018/0331542 A1 Nov. 15, 2018

Related U.S. Application Data

(63) Continuation of application No. 14/628,079, filed on Feb. 20, 2015, now Pat. No. 10,069,306.

(Continued)

(51) Int. Cl.
*H02J 3/38* (2006.01)
*H02S 50/00* (2014.01)
(Continued)

(52) U.S. Cl.
CPC ........ *H02J 3/383* (2013.01); *H01L 31/02021* (2013.01); *H02J 3/14* (2013.01);
(Continued)

(58) Field of Classification Search
CPC ...... H02J 3/383; H02J 3/14; H02J 3/46; H02J 7/35; H02J 9/062; H02J 7/345;
(Continued)

(56) References Cited

U.S. PATENT DOCUMENTS 4,981,525 A   1/1991   Kiyama et al.
5,215,599 A   6/1993   Hingorani et al.
(Continued)

FOREIGN PATENT DOCUMENTS

CN   1474461 A    2/2004
CN   102231395 A  11/2011
(Continued)

OTHER PUBLICATIONS

EP, Communication pursuant to Article 94(3) EPC, Patent Application No. 17 192 984.7, dated Sep. 28, 2018.
(Continued)

*Primary Examiner* — Zeev V Kitov
(74) *Attorney, Agent, or Firm* — Orrick, Herrington & Sutcliffe, LLP

(57) ABSTRACT

A solar cell management system for increasing the efficiency and power output of a solar cell and methods for making and using the same. The management system provides an electric field across an individual solar cell, an array of solar cells configured as a panel, or a group of solar panels. The imposed electric field exerts a force on both the electrons and holes created by light incident on the solar cell and accelerates the electron-hole pairs towards the electrodes of the solar cell. Compared to conventional solar cells, these accelerated electron-hole pairs travel a shorter distance from creation (by incident optical radiation) and spend less time within the solar cell material, therefore the electron-hole pairs have a lower likelihood of recombining within the cells' semiconductor's material. This reduction in the electron-hole recombination rate results in an overall increase in the solar cells' efficiency and greater power output.

53 Claims, 14 Drawing Sheets

Related U.S. Application Data

(60) Provisional application No. 61/943,127, filed on Feb. 21, 2014, provisional application No. 61/943,134, filed on Feb. 21, 2014, provisional application No. 61/947,326, filed on Mar. 3, 2014, provisional application No. 62/022,087, filed on Jul. 8, 2014.

(51) Int. Cl.

| | | |
|---|---|---|
| *H02J 7/35* | (2006.01) | |
| *H02S 40/32* | (2014.01) | |
| *H01L 31/02* | (2006.01) | |
| *H02J 3/14* | (2006.01) | |
| *H02J 3/46* | (2006.01) | |
| *H02J 9/06* | (2006.01) | |
| *H02J 7/34* | (2006.01) | |

(52) U.S. Cl.
CPC .................................. *H02J 3/46* (2013.01); *H02J 7/35* (2013.01); *H02J 9/062* (2013.01); *H02S 40/32* (2014.12); *H02S 50/00* (2013.01); *H02J 7/345* (2013.01); *Y02E 10/563* (2013.01); *Y02E 10/566* (2013.01)

(58) Field of Classification Search
CPC ... H02S 40/32; H02S 50/00; H01L 31/02021; Y02E 10/563; Y02E 10/566
USPC ........................................................ 307/116
See application file for complete search history.

(56) References Cited

U.S. PATENT DOCUMENTS

| | | | |
|---|---|---|---|
| 6,365,825 | B1 | 4/2002 | Hayashi et al. |
| 7,969,757 | B2 | 6/2011 | Kernahan |
| 8,466,582 | B2 | 6/2013 | Fornage |
| 9,559,518 | B2 | 1/2017 | Charkin et al. |
| 9,772,260 | B2 | 9/2017 | Conklin et al. |
| 2004/0264225 | A1 | 12/2004 | Bhavaraju et al. |
| 2007/0204899 | A1 | 9/2007 | Boyd, Sr. |
| 2009/0078304 | A1 | 3/2009 | Gilmore et al. |
| 2009/0160258 | A1 | 6/2009 | Allen et al. |
| 2010/0275968 | A1 | 11/2010 | Kaiser et al. |
| 2012/0006408 | A1 | 1/2012 | El-Ghoroury et al. |
| 2012/0205974 | A1 | 8/2012 | McCaslin et al. |
| 2013/0125950 | A1 | 5/2013 | Zingher |
| 2013/0306140 | A1 | 11/2013 | Edmonson et al. |
| 2015/0107644 | A1 | 4/2015 | Kumar |

FOREIGN PATENT DOCUMENTS

| | | |
|---|---|---|
| CN | 102473764 B | 5/2012 |
| CN | 103097974 A | 5/2013 |
| CN | 103098222 A | 5/2013 |
| DE | 20 2012 011176 U1 | 5/2013 |
| GB | 2498448 A | 7/2013 |
| JP | H07-337049 A | 12/1995 |
| JP | H08-162656 A | 6/1996 |
| JP | H10-173215 A | 6/1998 |
| JP | H11-251615 A | 9/1999 |
| JP | 2002-299675 A | 10/2002 |
| KR | 10-2009-0128954 A | 12/2009 |
| KR | 10-2013-0100981 A | 9/2013 |
| KR | 10-2014-0008531 A | 1/2014 |
| WO | WO 2006/078685 A2 | 7/2006 |
| WO | WO 2008/125915 A2 | 10/2008 |
| WO | WO 2010/070621 A1 | 6/2010 |
| WO | WO 2012/162268 A2 | 11/2012 |
| WO | WO 2015/057913 A2 | 4/2015 |

OTHER PUBLICATIONS

EP, Communication pursuant to Article 94(3) EPC, Patent Application No. 17 204 510.6, dated Sep. 28, 2018.
JP, Notification of Reasons for Refusal, Patent Application No. 2017-043626, dated Oct. 17, 2018.
AU, Examination Report No. 1, Application No. 2017232123, dated Jan. 23, 2019.
CL, Examiner Report, Application No. 201800392, dated Jan. 14, 2019.
CL, Examiner Report, Application No. 201800393, dated Jan. 14, 2019.
CN, Second Office Action, Application No. 201710201991.3, dated Jan. 9, 2019.
KR, Korean Notice of First Refusal, Application No. 10-2018-7007815, dated Dec. 31, 2018.
KR, Notification of Provisional Rejection, Application No. 10-2019-7000325, dated Jan. 18, 2019.
KR, Notification of Provisional Rejection, Application No. 10-2019-7000365, dated Jan. 18, 2019.
PH, Subsequent Substantive Examination Report, Application No. 1/2016/501643, dated Jan. 11, 2019.
PH, Substantive Examination Report, Application No. 1/2017/500545, dated Jan. 11, 2019.
PH, Substantive Examination Report, Application No. 1/2017/500562, dated Jan. 11, 2019.
SG, Written Opinion, Application No. 10201706204W, dated Dec. 18, 2018.
AU, Examination Report No. 1, Australian Application No. 2015218726, dated Feb. 27, 2017.
AU, Examination Report No. 1, Australian Application No. 2015227260, dated Mar. 9, 2017.
AU, Examination Report No. 2, Australian Patent Application No. 2015227260, dated May 1, 2017.
AU, Examination Report No. 2, Australian Patent Application No. 2015218726, dated May 14, 2017.
CA, Examiner Report, Canadian Application No. 2,939,004, dated Mar. 15, 2017.
CA, Examiner's Report, Canadian Application No. 2,937,025, dated Jul. 11, 2017.
CA, Examiner's Report, Canadian Application No. 2,939,004, dated Jul. 21, 2017.
CL, Expert Examiner Report, Patent Application No. 201602108, dated Nov. 16, 2017.
CL, Expert Examiner Report, Patent Application No. 201602210, dated Nov. 16, 2017.
CN, Notification of the First Office Action, Chinese Application No. 201580012041.5, dated Jun. 8, 2017.
CN, Second Office Action, Application No. 201580012041.5, dated Sep. 21, 2017.
CN, Third Office Action, Application No. 201580012041.5, dated Jan. 26, 2018.
CN, First Office Action, Application No. 201710141110.3, dated Jun. 21, 2018.
CN, First Office Action, Application No. 201710201991.3, dated Aug. 2, 2018.
EA, Conclusion on patentability of an invention, Application No. 201691604/31, dated Oct. 6, 2017.
EA, Notification, Patent Application No. 201691635/31, dated Jan. 24, 2018.
EA, Notification, Patent Application No. 201691604/31, dated Feb. 15, 2018.
EA, Patent Search Report, Application No. 201792352, dated May 11, 2018.
EP, Communication pursuant to Article 94(3) EPC, Patent Application No. 16 189 404.3, dated Dec. 11, 2017.
EP, Communication pursuant to Article 94(3) EPC, Application No. 17 192 984.7, dated Mar. 5, 2018.
EP, Communication pursuant to Article 94(3) EPC, Application No. 17 192 983.9, dated Mar. 6, 2018.
EP, Extended European Search Report, Application No. 17 20 4510.6, dated Mar. 20, 2018.
EP, Extended European Search Report, Application No. 17 20 4517.1, dated Mar. 21, 2018.
EP, Search Report, European Application No. 16189399.5, dated Feb. 14, 2017.

(56) References Cited

OTHER PUBLICATIONS

EP, Search Report, European Application No. 16189404.3, dated Mar. 2, 2017.
EP, Communication pursuant to Article 94(3) EPC, Patent Application No. 16 189 399.5, dated May 9, 2017.
EP, Communication pursuant to Article 94(3) EPC, Patent Application No. 15 710 361.5, dated May 17, 2017.
EP, Communication pursuant to Article 94(3) EPC, Application No. 16 189 399.5, dated Oct. 5, 2017.
EP, Communication pursuant to Article 94(3) EPC, Application No. 16 189 399.5, dated Feb. 16, 2018.
EP, Communication pursuant to Article 94(3) EPC, Application No. 16 189 404.3, dated Apr. 10, 2018.
JP, Notice of Grounds for Rejection, Patent Application No. 2017-043626, dated Feb. 20, 2018.
JP, Notice of Grounds for Rejection, Japanese Patent Application No. 2016-553379, dated Mar. 21, 2017.
JP, Notice of Grounds for Rejection, Japanese Patent Application No. 2016-555354, dated Mar. 21, 2017.
JP, Notice of Grounds for Rejection, Patent Application No. 2017-043629, dated Sep. 19, 2017.
JP, Notice of Grounds for Rejection, Patent Application No. 2017-043626, dated Jun. 19, 2018.
KR, Office Action, Korean Application No. 10-2016-7027166, dated Mar. 9, 2017.
KR, Office Action, Korean Application No. 10-2017-7005180, dated Mar. 9, 2017.
KR, Notification of Provisional Rejection, Korean Application No. 10-2017-7005174, dated May 26, 2017.
KR, Notification of First Refusal, Application No. 10-2017-7005180, dated Aug. 21, 2017.
KR, Notification of Provisional Rejection, Patent Application No. 10-2017-7033565, dated Jan. 5, 2018.
KR, Notification of Reason for Refusal, Application No. 10-2018-7007815, dated Mar. 29, 2018.
KR, Notification of Reason for Refusal, Application No. 10-2018-7007818, dated May 4, 2018.
NZ, First Examination Report, Patent Application No. 722832, dated Dec. 16, 2016.
NZ, First Examination Report, Patent Application No. 721992, dated Feb. 13, 2017.
NZ, Further Examination Report, Patent Application No. 721992, dated Aug. 17, 2017.
NZ, Further Examination Report, Patent Application No. 721992, dated Dec. 8, 2017.
PH, Substantive Examination Report, Application No. 1-2016-501643, dated Apr. 26, 2018.
SG, Written Opinion, Patent Application No. 11201607087S, dated Aug. 24, 2017.
U.S. Office Action, U.S. Appl. No. 14/628,079, dated Aug. 18, 2017.
U.S. Office Action, U.S. Appl. No. 15/410,637, dated Nov. 3, 2017.
WO, International Search Report & Written Opinion, Application No. PCT/US2015/016981, dated Jun. 26, 2015.
WO, International Search Report & Written Opinion, Application No. PCT/US2015/018552, dated Jun. 29, 2015.
Lazić, P., et al., "Low intensity conduction states in $FeS_2$: implications for absorption, open-circuit voltage and surface recombination", Journal of Physics: Condensed Matter, 25 (2013) 465801, pp. 1-10, Nov. 25, 2013.
Paraskeva, Vasiliki, et al., "Voltage and light bias dependent quantum efficiency measurements of GaInP/GaInAs/Ge triple junction device", Solar Energy Materials & Solar Cells, 116 (2013), pp. 55-60, May 8, 2013.
SunPower, "SunPower Discovers the 'Surface Polarization' Effect in High Efficiency Solar Cells," Aug. 2005.

300

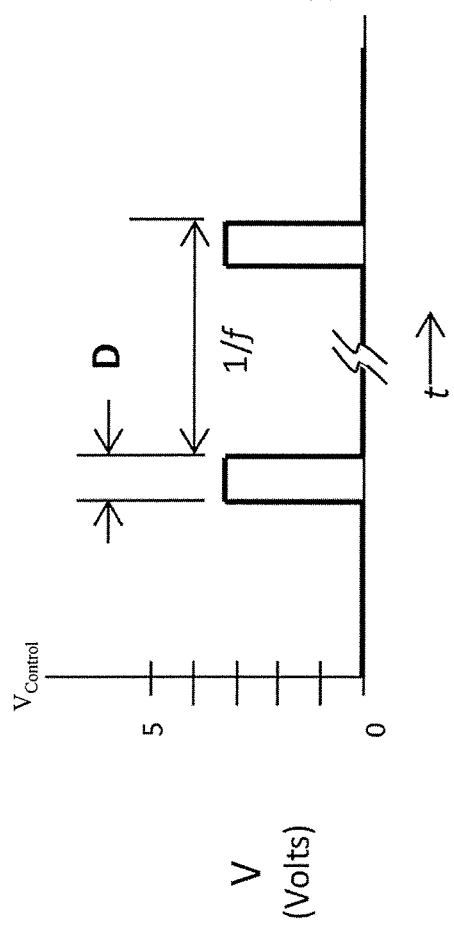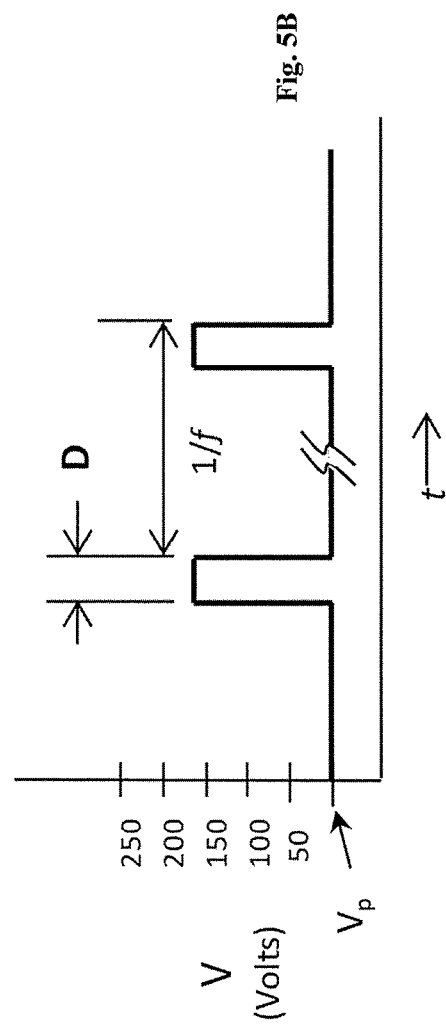

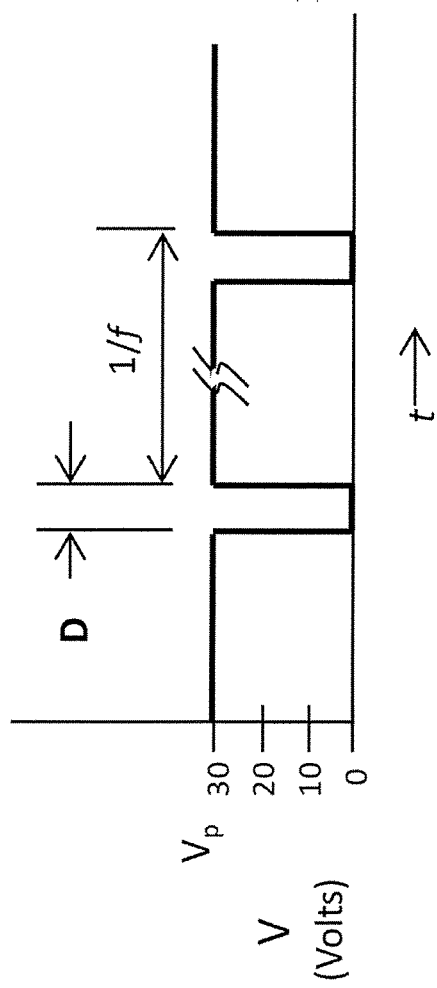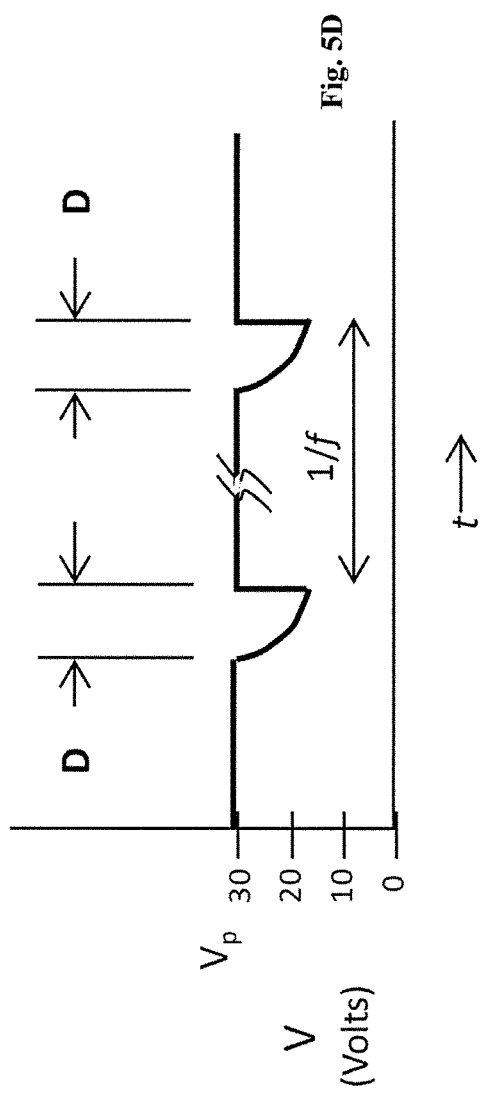

SYSTEM AND METHOD FOR MANAGING THE POWER OUTPUT OF A PHOTOVOLTAIC CELL

CROSS-REFERENCE TO RELATED APPLICATIONS

This application is a continuation application of co-pending U.S. patent application Ser. No. 14/628,079, filed Feb. 20, 2015, which claims the benefit of U.S. Provisional Application No. 61/943,127, filed Feb. 21, 2014; U.S. Provisional Application No. 61/943,134, filed Feb. 21, 2014; U.S. Provisional Application No. 61/947,326, filed Mar. 3, 2014; and U.S. Provisional Application No. 62/022,087, filed Jul. 8, 2014, the disclosures of which are hereby incorporated by reference in their entirety and for all purposes.

FIELD

The present disclosure relates generally to photovoltaic devices and more specifically, but not exclusively, to systems and methods for maximizing the power or energy generated and the overall efficiency of one or more solar cells, for example, by applying and adjusting an external electric field across the solar cells.

BACKGROUND

A solar cell (also called a photovoltaic cell) is an electrical device that converts the energy of light directly into electricity by a process known as "the photovoltaic effect." When exposed to light, the solar cell can generate and support an electric current without being attached to any external voltage source.

The most common solar cell consists of a p-n junction 110 fabricated from semiconductor materials (e.g., silicon), such as in a solar cell 100 shown in FIG. 1. For example, the p-n junction 110 includes a thin wafer consisting of an ultra-thin layer of n-type silicon on top of a thicker layer of p-type silicon. Where these two layers are in contact, an electrical field (not shown) is created near the top surface of the solar cell 100, and a diffusion of electrons occurs from the region of high electron concentration (the n-type side of the p-n junction 110) into the region of low electron concentration (the p-type side of the p-n junction 110).

The p-n junction 110 is encapsulated between two conductive electrodes 101a, 101b. The top electrode 101a is either transparent to incident (solar) radiation or does not entirely cover the top of the solar cell 100. The electrodes 101a, 101b can serve as ohmic metal-semiconductor contacts that are connected to an external load 30 that is coupled in series. Although shown as resistive only, the load 30 can also include both resistive and reactive components.

Typically, multiple solar cells 100 can be coupled (in series and/or parallel) together to form a solar panel 10 (shown in FIG. 2). With reference to FIG. 2, a typical installation configuration using at least one solar panel 10 is shown. The solar panels 10 can be connected either in parallel as shown in FIG. 2, series, or a combination thereof, and attached to a load, such as an inverter 31. The inverter 31 can include both resistive and reactive components.

Returning to FIG. 1, when a photon hits the solar cell 100, the photon either: passes straight through the solar cell material—which generally happens for lower energy photons; reflects off the surface of the solar cell; or preferably is absorbed by the solar cell material—if the photon energy is higher than the silicon band gap—generating an electron-hole pair.

If the photon is absorbed, its energy is given to an electron in the solar cell material. Usually this electron is in the valence band and is tightly bound in covalent bonds between neighboring atoms, and hence unable to move far. The energy given to the electron by the photon "excites" the electron into the conduction band, where it is free to move around within the solar cell 100. The covalent bond that the electron was previously a part of now has one fewer electron—this is known as a hole. The presence of a missing covalent bond allows the bonded electrons of neighboring atoms to move into the hole, leaving another hole behind. In this way, a hole also can move effectively through the solar cell 100. Thus, photons absorbed in the solar cell 100 create mobile electron-hole pairs.

The mobile electron—hole pair diffuses or drifts toward the electrodes 101a, 101b. Typically, the electron diffuses/drifts towards the negative electrode, and the hole diffuses/drifts towards the positive electrode. Diffusion of carriers (e.g., electrons) is due to random thermal motion until the carrier is captured by electrical fields. Drifting of carriers is driven by electric fields established across an active field of the solar cell 100. In thin film solar cells, the dominant mode of charge carrier separation is drifting, driven by the electrostatic field of the p-n junction 110 extending throughout the thickness of the thin film solar cell. However, for thicker solar cells having virtually no electric field in the active region, the dominant mode of charge carrier separation is diffusion. The diffusion length of minor carriers (i.e., the length that photo-generated carriers can travel before they recombine) must be large in thicker solar cells.

Ultimately, electrons that are created on the n-type side of the p-n junction 110, "collected" by the p-n junction 110, and swept onto the n-type side can provide power to the external load 30 (via the electrode 101a) and return to the p-type side (via the electrode 101b) of the solar cell 100. Once returning to the p-type side, the electron can recombine with a hole that was either created as an electron-hole pair on the p-type side or swept across the p-n junction 110 from the n-type side.

As shown in FIG. 1, the electron-hole pair travels a circuitous route from the point the electron-hole pair is created to the point where the electron-hole pair is collected at the electrodes 101a, 101b. Since the path traveled by the electron-hole pair is long, ample opportunity exists for the electron or hole to recombine with another hole or electron, which recombination results in a loss of current to any external load 30. Stated in another way, when an electron-hole pair is created, one of the carriers may reach the p-n junction 110 (a collected carrier) and contribute to the current produced by the solar cell 100. Alternatively, the carrier can recombine with no net contribution to cell current. Charge recombination causes a drop in quantum efficiency (i.e., the percentage of photons that are converted to electric current when the solar cell 100), and, therefore, the overall efficiency of the solar cell 100.

The cost of the solar cell 100 or the solar panel 10 is typically given in units of dollars per watts of peak electrical power that can be generated under normalized conditions. High-efficiency solar cells decrease the cost of solar energy. Many of the costs of a solar power system or plant are proportional to the number of solar panels required as well as the (land) area required to mount the panels. A higher efficiency solar cell will allow for a reduction in the number of solar panels required for a given energy output and the required area to deploy the system. This reduction in the number of panels and space used might reduce the total plant cost, even if the cells themselves are more costly.

The ultimate goal is to make the cost of solar power generation comparable to, or less than, conventional electrical power plants that utilize natural gas, coal, and/or fuel oil to generate electricity. Unlike most conventional means of generating electric power that require large centralized power plants, solar power systems can be deployed at large centralized locations by electric utilities, on commercial buildings to help offset the cost of electric power, and even on a residence by residence basis.

Recent attempts to reduce the cost and increase the efficiency of solar cells include testing various materials and different fabrication techniques used for the solar cells. Another approach attempts to enhance the depletion region formed around the p-n junction 110 for enhancing the movement of charge carriers through the solar cell 100. For example, see U.S. Pat. No. 5,215,599, to Hingorani, et al. ("Hingorani"), filed on May 3, 1991, and U.S. Pat. No. 8,466,582, to Fornage ("Fornage"), filed on Dec. 2, 2011, claiming priority to a Dec. 3, 2010 filing date, the disclosures of which are hereby incorporated by reference in their entireties and for all purposes.

However, these conventional approaches for enhancing the movement of charge carriers through the solar cell 100 require a modification of the fundamental structure of the solar cell 100. Hingorani and Fornage, for example, disclose applying an external electric field to the solar cell using a modified solar cell structure. The application of the external electric field requires a voltage to be applied between electrodes inducing the electric field (described in further detail with reference to equation 2, below). Without modifying the fundamental structure of the solar cell 100, applying the voltage to the existing electrodes 101a, 101b of the solar cell 100 shorts the applied voltage through the external load 30. Stated in another way, applying voltage to the electrodes 101a, 101b of the solar 100 is ineffective for creating an external electric field and enhancing the movement of charge carriers. Accordingly, conventional approaches—such as disclosed in Hingoriani and Fornage—necessarily modify the fundamental structure of the solar cell 100, such as by inserting an external (and electrically isolated) set of electrodes on the base of the solar cell 100. There are several disadvantages with this approach.

For example, the external electrodes must be placed on the solar cell 100 during the fabrication process—it is virtually impossible to retrofit the external electrodes to an existing solar cell or panel. This modification to the fabrication process significantly increases the cost of manufacturing and decreases the manufacturing yield. Additionally, placement of the external electrodes over the front, or incident side, of the solar cell 100 reduces the optical energy which reaches the solar cell 100, thereby yielding a lower power output.

As a further disadvantage, to yield significant improvements in power output of the solar cell 100, sizeable voltages must be applied to the external electrodes of the solar cell 100. For example, Fornage discloses that voltages on the order of "1,000's" of volts must be placed on the external electrodes for the applied electric field to be effective and increase the power output of the solar cell 100. The magnitude of this voltage requires special training for servicing as well as additional high voltage equipment and wiring that does not presently exist in existing or new solar panel deployments. As an example, an insulation layer between the external electrodes and the solar cell 100 must be sufficient to withstand the high applied voltage. In the event of a failure of the insulation layer, there is a significant risk of damage to not only the solar cell 100, but also all solar panels 10 connected in series or parallel to the failed solar cell as well as the external load 30 (or the inverter 31).

As a further disadvantage, varying illumination conditions (e.g., due to cloud coverage of the sun and/or normal weather fluctuations) can cause instability in the power output of conventional solar cells and solar panels. For example, with reference to FIG. 2, the inverter 31 typically requires a static, non-varying voltage and current input. As shown in FIG. 2, the solar panels 10 provide the input voltage and current to the inverter 31. However, time-varying illumination conditions can cause the output from solar panels 10 to fluctuate (e.g., on the order of seconds or less). The fluctuation of the voltage and current supplied to the inverter 31 compromises the quality of the power output by the inverter 31, for example, in terms of frequency, voltage, and harmonic content. Conventional efforts to combat varying illumination conditions include placing batteries or capacitors at the input of the inverter 31 and, unfortunately, only minimize these variations.

In view of the foregoing, a need exists for an improved solar cell system and method for increased efficiency and power output, such as with increased mobility of electron-hole pairs, in an effort to overcome the aforementioned obstacles and deficiencies of conventional solar cell systems.

BRIEF DESCRIPTION OF THE DRAWINGS

FIGS. 5A-D are exemplary waveforms illustrating the applied voltage as a function of time of the inputs and outputs of the switch used with the solar panel array of FIG. 4.

Figure 1:
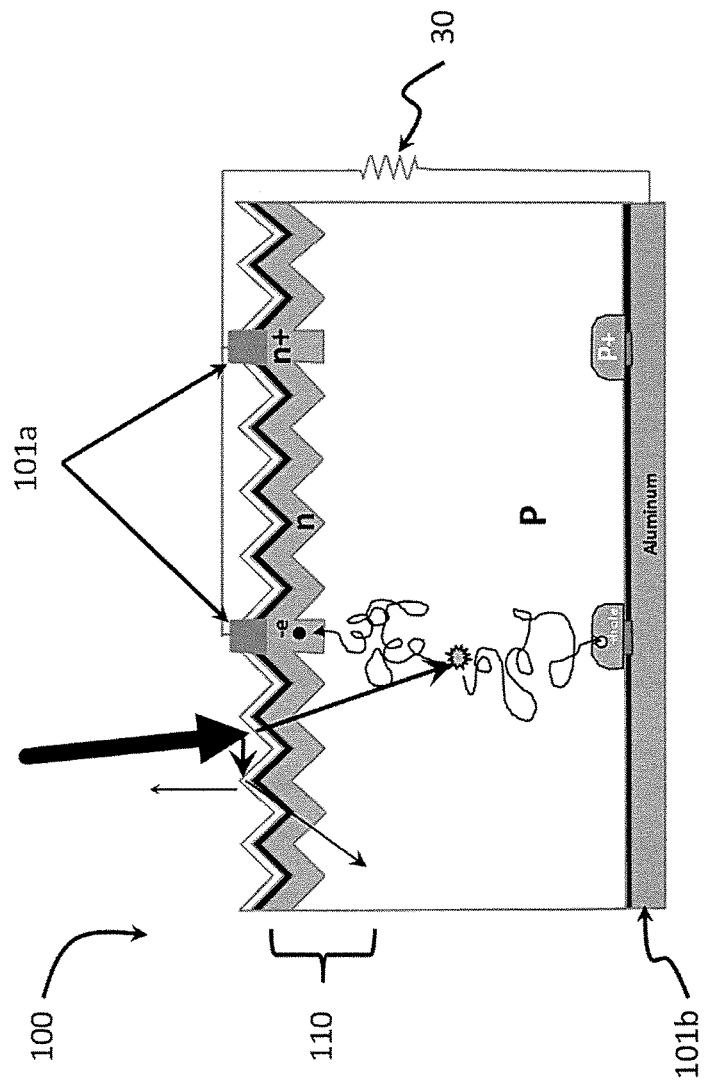
FIG. 1 is an exemplary top-level cross-sectional diagram illustrating an embodiment of a solar cell of the prior art.

It should be noted that the figures are not drawn to scale and that elements of similar structures or functions are generally represented by like reference numerals for illustrative purposes throughout the figures. It also should be noted that the figures are only intended to facilitate the description of the preferred embodiments. The figures do not illustrate every aspect of the described embodiments and do not limit the scope of the present disclosure.

DETAILED DESCRIPTION OF THE PREFERRED EMBODIMENTS

Since currently-available solar cell systems fail to maximize the power output of a photovoltaic cell, a solar cell system that increases the mobility of electron-hole pairs and reduces the recombination current in a semiconductor material can prove desirable and provide a basis for a wide range of solar cell systems, such as to increase the efficiency and power output of solar cells configured as a solar panel. This result can be achieved, according to one embodiment disclosed herein, by a solar cell management system 300 as illustrated in FIG. 3.

Figure 3:
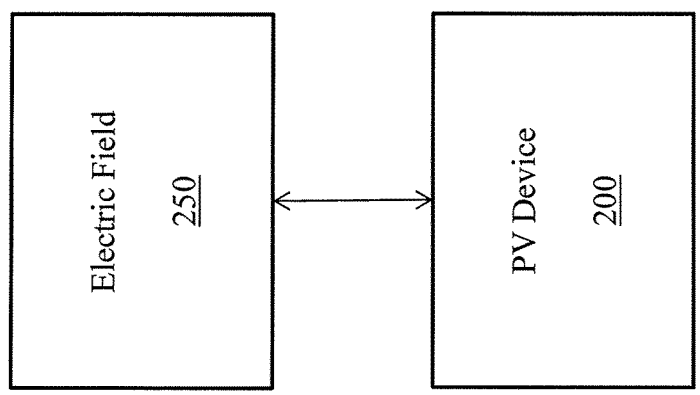
FIG. 3 is an exemplary top-level block diagram illustrating an embodiment of a solar cell management system.

Turning to FIG. 3, the solar cell management system 300 is suitable for use with a wide range of photovoltaic devices. In one embodiment, the solar cell management system 300 can be suitable for use with the solar cell 100 shown in FIG. 1. For example, the solar cell 100 can represent any suitable generation of solar cells such as wafer-based cells of crystalline silicon (first generation), thin film solar cells including amorphous silicon cells (second generation), and/or third generation cells. The solar cell management system 300 advantageously can be used with any generation of solar cell 100 without structural modification—and the associated drawbacks.

Figure 2:
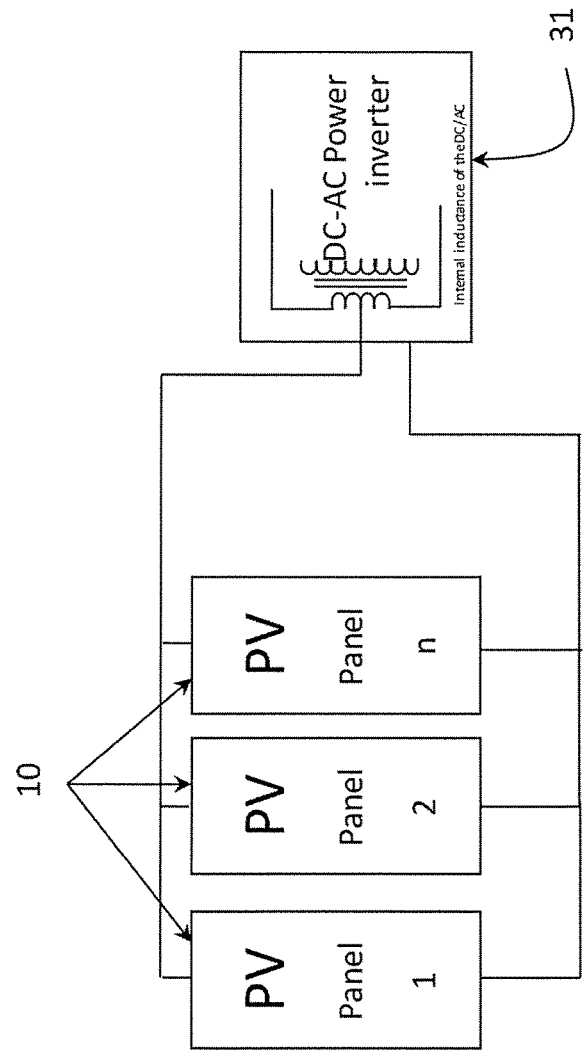
FIG. 2 is an exemplary top-level block diagram illustrating one embodiment of a solar panel array of the prior art using the solar cells of FIG. 1.

In another embodiment, the solar cell management system 300 can be suitable for use with multiple solar cells 100, such as the solar panels 10 shown in FIG. 2. As previously discussed, multiple solar cells 100 can be coupled (in series and/or parallel) together to form a solar panel 10. The solar panels 10 can be mounted on a supporting structure (not shown) via ground mounting, roof mounting, solar tracking systems, fixed racks, and so on and can be utilized for both terrestrial and space borne applications. Similarly, the solar cell management system 300 advantageously can be used with any generation of solar panel 10 without structural modification—and the associated drawbacks—of the solar panel 10.

As shown in FIG. 3, the photovoltaic device 200 cooperates with an electric field 250. In some embodiments, the polarity of the electric field 250 can be applied in either the same direction or the reverse direction as the polarity of the electrodes 101a, 101b (shown in FIG. 1) in the photovoltaic device 200. For example, if applying the electric field 250 in the same direction as the polarity of the electrodes 101a, 101b in the photovoltaic device 200, the electric field 250 acts on the electron-hole pairs in the photovoltaic device 200 to impose a force—e⁻E or h⁺E on the electron or hole, respectively—thereby accelerating the mobility of the electron and hole towards respective electrodes. Alternatively, if the polarity of the electric field 250 is reversed, the mobility of the electron-hole pairs in the photovoltaic device 200 decreases, thereby increasing the recombination current within the photovoltaic device 200. Accordingly, the efficiency of the photovoltaic device 200 can be diminished as desired, such as for managing the power output of the photovoltaic device 200.

Furthermore, the electric field 250 applied to the photovoltaic device 200 can be static or time varying as desired. In the case where the electric field 250 is time varying, the electric field 250 has a time averaged magnitude that is non-zero. Stated in another way, the net force on the electrons and holes is non-zero to provide increased mobility in the electron-hole pairs of the photovoltaic device 200.

If applied to the conventional solar cell 100 of FIG. 1, in the absence of an external load 30 (shown in FIG. 1), an external voltage can be applied across the electrodes 101a, 101b of the solar cell 100 to create the electric field 250. In one embodiment, the electric field 250 (e.g., between the electrodes 101a, 101b) is defined by Equation 1:

$$E = \frac{(V_{App} - V_P)}{t} \quad \text{(Equation 1)}$$

In Equation 1, E represents the electric field 250, $V_{App}$ is the voltage applied externally to the photovoltaic device 200, $V_P$ is the voltage output of the photovoltaic device 200 (e.g., ~30 volts), and t is the thickness of the semiconductor material in the photovoltaic device 200 from electrode 101a to 101b. For example, assuming $V_{App}-V_P$=200 Volts (nominally) and a thickness t of about 0.02 cm, the electric field 250 is about 10K Volts/cm. It can be seen from Equation 1 that as the thickness t of the photovoltaic device 200 decreases (e.g., less than 0.01 cm), higher electric fields 250 can be generated using the same or lower voltages.

As discussed above, the photovoltaic device 200 typically drives an external load, such as the load 30 of the solar cell 100. With reference to Equation 1, if applying an external voltage $V_{App}$ directly to the photovoltaic device 200 that drives the external load 30, the external load 30 can include resistive components that draw current from the source of the applied voltage $V_{App}$. Stated in another way, applying the external voltage $V_{App}$ to the photovoltaic device 200 can effectively deliver power to the overall circuit represented by Equation 2:

$$\text{Power}_{Input} = \frac{(V_{App})^2}{R_L} \quad \text{(Equation 2)}$$

In Equation 2, $R_L$ represents the impedance of the external load 30. In some cases, the input power can be substantially greater than the power output of the photovoltaic device 200. Accordingly, the solar cell management system 300 is configured to apply the electric field 250 across the photovoltaic device 200 without injecting more energy than the photovoltaic device 200 is capable of producing or more energy than would be gained by applying the electric field across the photovoltaic device 200.

Figure 4:
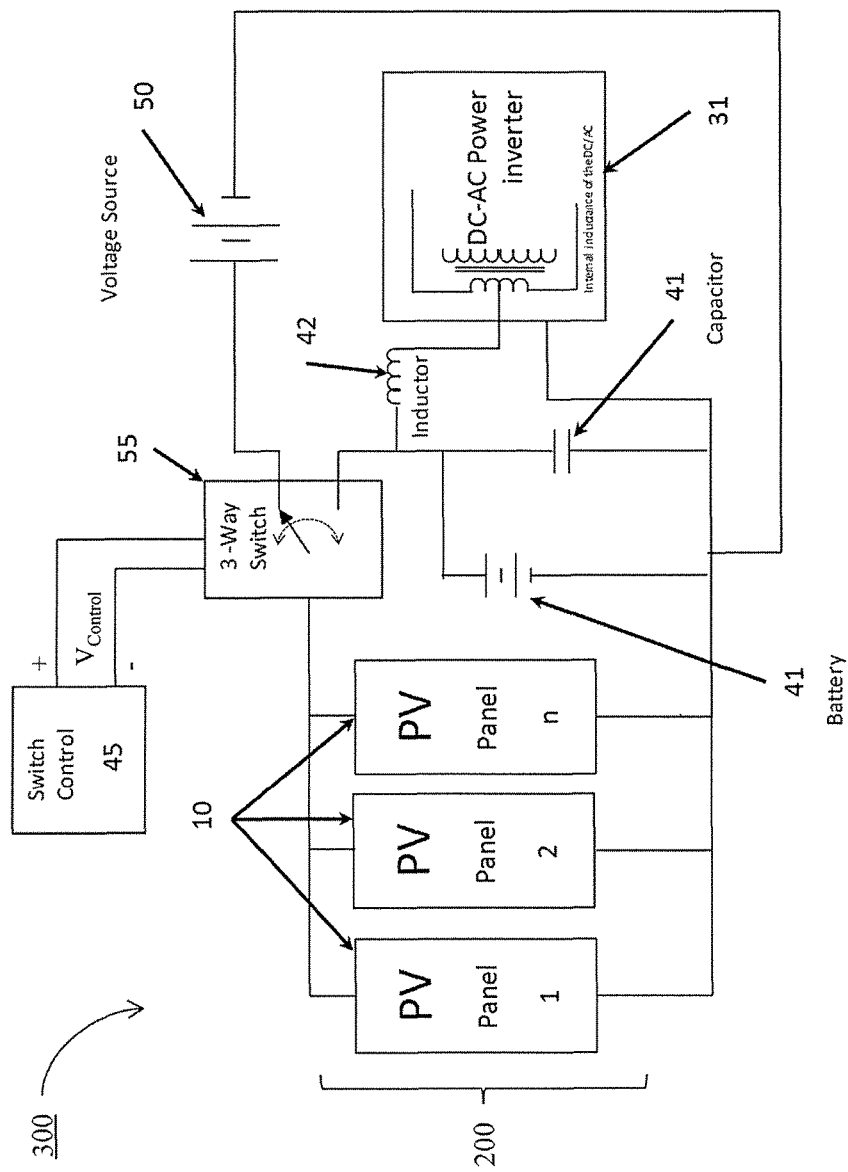
FIG. 4 is an exemplary block diagram illustrating an alternative embodiment of the solar cell management system of FIG. 3, wherein a solar panel array is coupled to a voltage source through a switch.

The solar cell management system 300 can apply the external voltage $V_{App}$ to the photovoltaic device 200 using any suitable means described herein, including using a switch 55 as shown in FIG. 4. Turning to FIG. 4, the photovoltaic device 200 can represent any number of photovoltaic devices such as the solar cell 100 and/or the solar panels 10 as illustrated. The solar panels 10 are connected to the switch 55, such as a single pole, double throw (or three-way) switch as shown. In one embodiment, the switch 55 is also coupled to a voltage source 50 and an external load $R_L$ (e.g., shown as the inverter 31). The inverter 31 can convert a DC voltage and current into an AC voltage and current, which is typically compatible in voltage and frequency with conventional AC power grids. The output frequency of the inverter 31 and the amplitude of the AC current/voltage can be based upon country, location, and local grid requirements.

The voltage source 50 can include any suitable means for maintaining a constant voltage, including ideal voltage sources, controlled voltage sources, and so on. However, in some embodiments—such as the embodiment shown below with reference to FIG. 9A—the voltage source 50 can have a variable, adjustable output (e.g., time varying voltage). A switch control (or controller) 45 is coupled to the switch 55 to control the duration of connection and/or the frequency of switching, such as between the voltage source 50 and the inverter 31 to the solar panels 10. The switch controller 45 can be preset to operate at a fixed switching duration D and switching frequency f (shown in FIGS. 5A-C). The voltage applied in the first position of the switch 55 can be fixed and based on the voltage source 50. In some embodiments, the magnitude of the voltage applied by voltage source 50, the duration D of connection, and/or the frequency f of switching can be preset and/or vary based on load conditions.

For example, the switch 55 connects the solar panels 10 with the voltage source 50 in a first position (as shown with the arrow in the switch 55 of FIG. 4). When connected in the first position, the voltage source 50 applies a voltage $V_{APP}$ across the electrodes 101a, 101b (shown in FIG. 1) of the solar panels 10 and induces the electric field 250 (shown in FIG. 3) across each solar panel 10. Once the electric field 250 has been established across the solar panels 10, the switch 55 switches to connect the solar panels 10 to the inverter 31 (i.e., the load $R_L$) in a second position. Accordingly, the voltage source 50 can provide the electric field 250 without being connected to the solar panels 10 and the inverter 31 at the same time. Therefore, with reference again to Equation 2, applying the external voltage $V_{APP}$ does not allow the load $R_L$ (e.g., the inverter 31) to draw current directly from the voltage source 50.

Application of the electric field 250 to the solar panels 10 can increase the current and power output of the solar panels 10 by a predetermined amount when the solar panels 10 subsequently are connected to the inverter 31 in the second position. The predetermined amount is dependent upon an intensity of light incident on the solar panels 10, the voltage applied $V_{APP}$ to the solar panels 10 by the voltage source 50, the thickness of the solar panels 10, the frequency f that the voltage source 50 is connected to the solar panels 10, and the duty cycle of the switching process between the first position and the second position—with the duty cycle being defined as the amount of time that the solar panels 10 are connected to the voltage source 50 divided by 1/f the switching time (i.e., multiplied by the frequency f or divided by the total period of the signal). It should be noted that the switch duration time D, the switching frequency f, and the duty cycle are all interrelated quantities such that quantifying any two of the quantities allows for determination of the third quantity. For example, specifying the switching frequency and the duty cycle allows for determination of the switch duration time D. For example, under high intensity light conditions, the improvement in power output can be on the order of 20%; under low light conditions, 50+%.

The embodiment shown in FIG. 4 advantageously provides the electric field 250 to the photovoltaic device 200 without the need to modify the solar panels 10 and/or solar cells 100 to include additional, external electrodes.

In some embodiments, an energy storage device—such as a capacitor 41, an inductor 42, and/or a battery 43—can be placed before the inverter 31 to mitigate any voltage dropout being seen by the inverter 31 while the switch 55 is in the first position. Accordingly, while the inverter 31 (i.e., load) is disconnected from the solar panels 10 when the switch 55 is in the first position and the electric field 250 is being established across the solar panels 10 (i.e., switching time D shown in FIGS. 5A-D), the energy storage device supplies energy to the inverter 31 to keep current flowing during this switched period. Stated in another way, the energy storage device can discharge while the solar panels 10 are disconnected from the inverter 31.

Therefore, a constant voltage from the voltage source 50—which in turn creates the electric field 250—need not be applied continuously to see an improvement in the power output of the solar panels 10. For example, with duration switching times D of nominally 10-2000 ns, $V_{App}$'s of nominally 100-500+ Volts, and a switching frequency f of 20µ seconds, the duty cycle of nominally 0.1-10% can be used. The inductor 42, the capacitor 41, and/or the battery 43 are chosen to be of sufficient size to provide enough discharge while the solar panels 10 are disconnected while the electric field 250 is being placed across the solar panels 10 so as not to cause a drop out on the output of the inverter 31.

For example, the size of the capacitor 41 that is placed across the load (e.g., the inverter 31) is determined by the acceptable voltage droop that the inverter 31 can tolerate during the switching time D. For example, if the voltage droop during the switching time D is not to be less than 90% maximum voltage generated by the photovoltaic device 200, the capacitor needs to be sized such according to Equation 3:

$$C_{41} = \frac{-D}{R_L \ln(\text{Max}V)} \quad \text{(Equation 3)}$$

In Equation 3, D is the duration the switch is connected to the voltage source 50 and MaxV is the percentage of the maximum voltage required (e.g., 90% in the example above). In a similar manner, the inductance and/or the battery can be calculated.

FIG. 5A illustrates control voltage as a function of time from the switch controller 45 to activate and control the switch 55 using the solar cell management system 300 of FIG. 4. In this example, the solar panels 10 are disconnected from the inverter 31 and connected to the voltage source 50 in the first position of the switch 55 for the duration D, which is repeated every 1/f seconds. FIG. 5B illustrates the voltage as a function of time from the voltage source 50 provided to the switch 55 at the first position. FIG. 5C illustrates the output voltage of the switch 55 from the solar panels 10 (when wired in parallel) as a function of time at the output of the switch 55 that couples to the inverter 31 in the second position. Similarly, FIG. 5D illustrates the voltage as a function of time at the output of the switch 55 that couples to the inverter 31 having a capacitor 41 coupled there between.

The drop in voltage seen by the inverter 31 shown in FIG. 5D at the end of the switching duration D is designated the voltage droop discussed above. The voltage droop is dependent on the size of the capacitor 41, the inductor 42, and/or the battery 43. In one example of the system 300 that does not include the capacitor 41, the inductor 42, or the battery 43, the voltage applied across the input of the inverter 31 appears as the output voltage illustrated in FIG. 5C.

Figure 6:
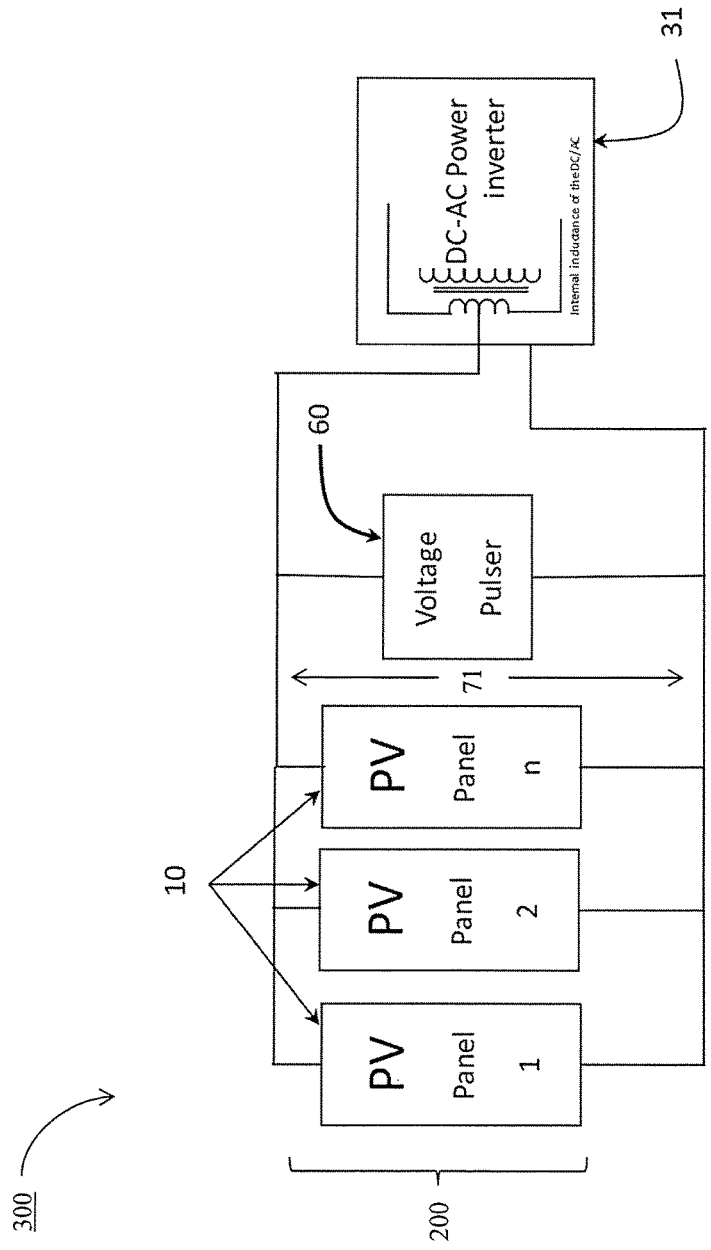
FIG. 6 is an exemplary block diagram illustrating another alternative embodiment of the solar cell management system of FIG. 3, wherein a solar panel array is coupled to a voltage pulser circuit.

FIG. 6 illustrates an alternative embodiment of the solar cell management system 300 of FIG. 3. Turning to FIG. 6, the photovoltaic device 200 can represent any number of photovoltaic devices such as the solar cell 100 and/or the solar panels 10 as illustrated. As shown, the solar panels 10 are wired in parallel, but can also be wired in series and any combination thereof.

A voltage pulser 60, such as a high voltage pulse generator, can apply a time varying voltage pulse 71 (shown in FIG. 7) across one or more of the solar panels 10. In one embodiment, a duration $D_P$ of the voltage pulse 71 can be short—nominally 10-2000 ns—and a magnitude can be high—nominally 100-500+ Volts. In the embodiment shown in FIG. 6, the voltages applied, the pulse width, and the pulse repetition rate are fixed at a predetermined level to provide optimum performance under selected operating conditions. For example, with reference to FIGS. 6 and 7, the voltage pulse 71 has the duration $D_P$ of about 1000 ns, which voltage pulse 71 is repeated with a period of 1/f. The duration $D_P$ of the voltage pulse 71 and the frequency f of the voltage pulse 71 are chosen such that the reactance of inductors in the voltage inverter 31 present a high impedance to the voltage pulser 60, which high impedance allows a high voltage to be developed across the electrodes 101a, 101b (shown in FIG. 1) of the solar panels 10 and not be shorted out by the inverter 31.

Additionally, series inductors (not shown) can be placed at the input of the inverter 31, which series inductors are capable of handling the current input to the inverter 31 and act as an RF choke such that the voltage pulses 71 are not attenuated (or effectively shorted) by the resistive component of the inverter 31. The duty cycle (time the pulse is on/time the pulse is off) can be nominally 0.1-10%.

The strength of the electric field 250 imposed on the photovoltaic device 200 is a function of the construction of the photovoltaic device 200, such as the thickness of the photovoltaic device 200, the material and dielectric constant of the photovoltaic device 200, the maximum breakdown voltage of the photovoltaic device 200, and so on.

Figure 7:
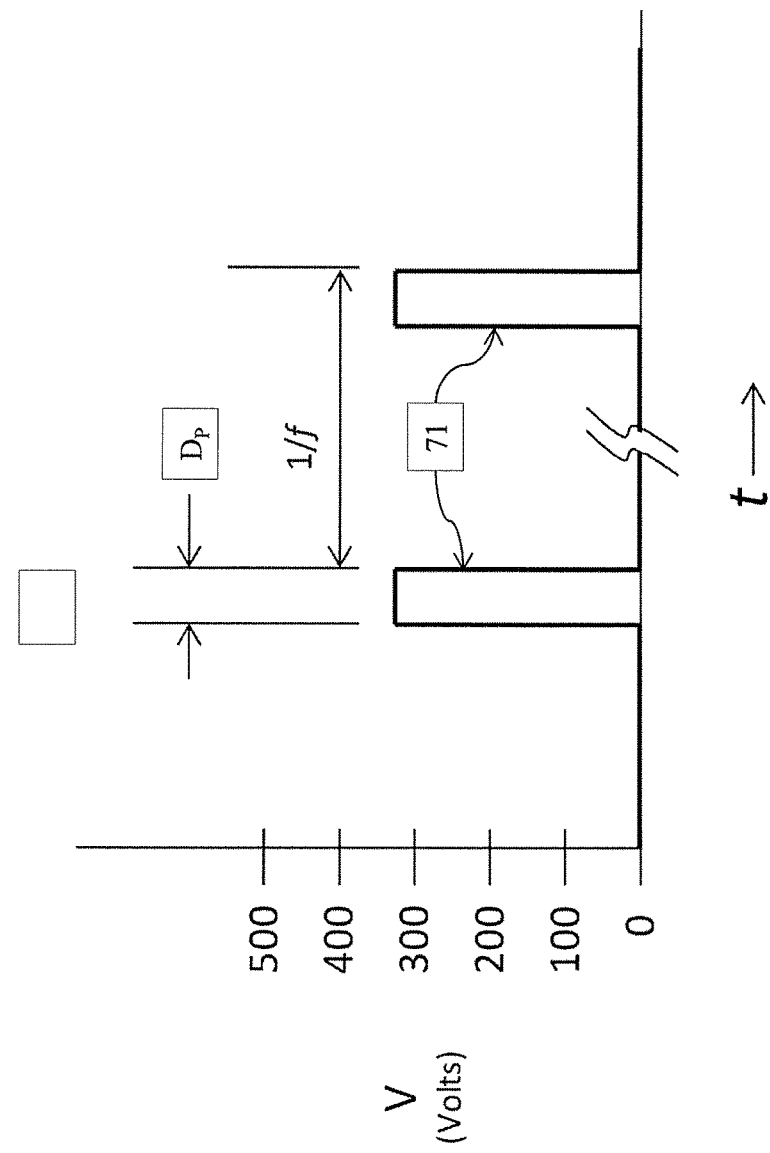
FIG. 7 is an exemplary waveform illustrating the applied voltage as a function of time used with the solar panel array of FIG. 6.

For the voltage pulse 71 shown in FIG. 7, a Fourier analysis of this waveform results in a series of pulses with frequencies $\omega = n\omega_o$ where $\omega_o = 2\pi f$ and the strength of the pulses is given by Equation 4:

$$V(\omega) = 2\pi\tau V_{App} \sum_{n=-\infty}^{\infty} \frac{\sin n\pi\tau}{n\pi\tau} \quad \text{(Equation 4)}$$

In Equation 4, n is a series of integers from $-\infty$ to $+\infty$. Accordingly, the 0th order pulse (i.e., n=0) has a DC component that is shorted through the resistive load $R_L$. The first order of the voltage pulse 71 applied across the solar panels 10 is $V_{App}(1-D_P/f)$, where $D_P/f$ is the duty cycle of the pulse, $D_P$ is the pulse duration, and f is the repetition rate of the pulse. Since the inductance of the inverter 31 acts as a high impedance Z to the voltage pulse 71 generated by the embodiment of FIG. 6, a high voltage pulse 71 is developed across each of the solar panels 10, which, in turn, creates a high electric field 250 across the solar panels 10.

As shown in FIG. 6, the voltage inverter 31 represents the external load $R_L$. However, the external load $R_L$ can include purely resistive components such that a set of inductors can be placed in series with the load $R_L$ to act as the RF choke so that the voltage pulse 71 (and the electric field 250) is applied across the solar panels 10.

Figure 8:
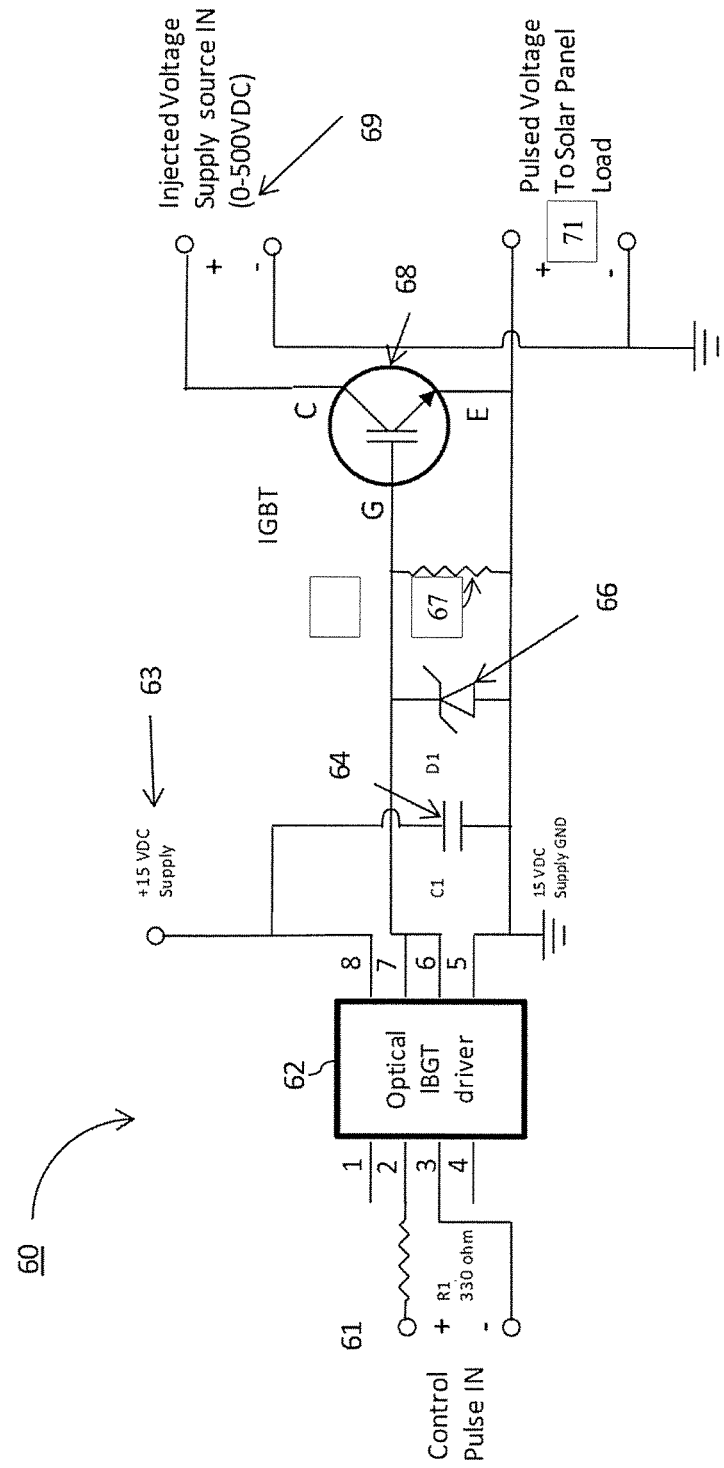
FIG. 8 is an exemplary block diagram illustrating one embodiment of the voltage pulser circuit of FIG. 6.

Any number of circuits can be used in the voltage pulser 60 to apply the voltage pulse 71 as desired. One such exemplary circuit used in the voltage pulser 60 is shown in FIG. 8. As illustrated, the voltage pulser 60 includes a pulse generator 61 (not shown), a high voltage source 69 (not shown), and a switching transistor 68 for impressing the high voltage pulse 71 on the solar panels 10 (e.g., by switching the output of the high voltage source 69 to the solar panels 10) shown in FIG. 6. The voltage pulser 60 of FIG. 8 contains a device that transfers electrical signals between two, electrically isolated, circuits using light, such as an opto-isolator 62 to isolate the pulse generator 61 from the high voltage switching transistor 68. Advantageously, the opto-isolator 62 prevents a high voltage (e.g., from the high voltage source 69) from affecting the pulse signal 71. The opto-isolator circuit 62 is illustrated with pins 1-8 and is shown as part of the input circuit to the voltage pulser 60.

A bias voltage supply 63 (not shown) provides voltage (e.g., 15 VDC) to the opto-isolator 62 to supply the required bias for the opto-isolator 62. A capacitor 64 isolates the bias voltage supply 63, creating an AC path for any signal from distorting the bias supply to the opto-isolator 62. Pins 6 and 7 of the opto-isolator 62 are the switching signal output of the opto-isolator 62 used to drive the high voltage switching transistor 68. A diode 66—such as a Zener diode—is used to hold the switching threshold of the switching transistor 68 to above the set point of the diode 66, eliminating any noise from inadvertently triggering the switching transistor 68. Resistor 67 sets the bias point for the gate G and emitter E of the switching transistor 68. When the voltage applied across pins 6 and 7 of the opto-isolator 62 exceeds the threshold set by the resistor 67, the switching transistor 68 is turned "on" and current flows between the collector C and the emitter E of the high voltage switching transistor 68. Accordingly, the high voltage switching transistor 68 presents an Injected High Voltage source to the solar panels 10 until the Control Pulse IN from the pulse generator 61 drops below the set threshold on the G of the high voltage switching transistor 68, which stops the current flow across C-G shutting the switching transistor 68 "off."

As in the previous embodiments described above, application of the electric field 250 to the solar panels 10 can increase the current and power output of the solar panels 10 when subsequently connected to the inverter 31 by a predetermined amount (e.g., dependent upon the intensity of light incident on solar panels 10, the voltage applied $V_{APP}$ to the solar panels 10 by the voltage source 50, the thickness of the solar panels 10, the pulse width $D_P$, and the frequency f that the voltage pulse 71 is applied to the solar panels 10, and so on). Similarly, under high intensity light conditions, the improvement in power output of the solar panels 10 can be on the order of 20%; and under low light conditions can be 50+%.

The improvement in the performance of the photovoltaic device 200 cooperating with the electric field 250 can be measured as an increase in the short circuit current of the solar cell, $I_{sc}$, as shown in Equation 5:

$$I_{sc} = I_{Base}[1 + c(V(\tau,f)t,\varepsilon)*(p_{max}-p)] \quad \text{(Equation 5)}$$

where $I_{Base}$ is the short circuit current when no external electric field 250 is applied and $p_{max}$ is the maximum optical power whereby any additional power does not create any additional electron-hole pairs. As the improvement in the current output of the solar cell is driven by the electric field 250, the form of $c(V(\tau, f),t,\varepsilon)$ can be described by Equation 6:

$$c(V(\tau,f),t,\varepsilon)=m(t,\varepsilon)V_{App}*(1-\exp(\tau/\tau_o))*\exp(-f_{decay}/f) \quad \text{(Equation 6)}$$

In Equation 6, $m(t, \varepsilon)$ is dependent on the photovoltaic device 200. The improvement in the short circuit current $I_{sc}$ due to the electric field 250 can be linear with respect to the applied voltage $V_{App}$. The improvement observed with respect to the pulse repetition rate has a characteristic decay rate of $(1/f_{decay})$ and to behave exponentially with respect to the pulse rate f. The improvement observed with respect to the pulse width $\tau$ can also behave exponentially and describe how quickly the applied voltage $V_{App}$, reaches full magnitude. The improvement observed with respect to the pulse width $\tau$ is dependent upon the details of the voltage pulser 60. The increase in the short circuit current $I_{sc}$, as a function of applied voltage $V_{App}$, the pulse repetition rate f, and the pulse width $\tau$, are shown in FIGS. 11A-C, respectively.

Figure 11A:
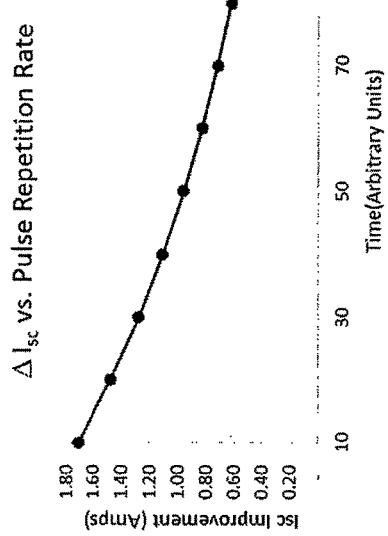
FIGS. 11A-C are exemplary waveforms illustrating an embodiment of the relationship between applied voltage, pulse frequency, and pulse width to the improved current output of the photovoltaic device of FIG. 3.
Figure 11B:
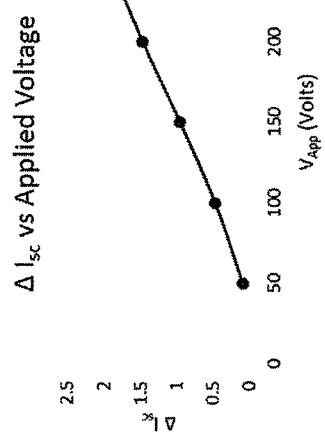
Figure 11C:
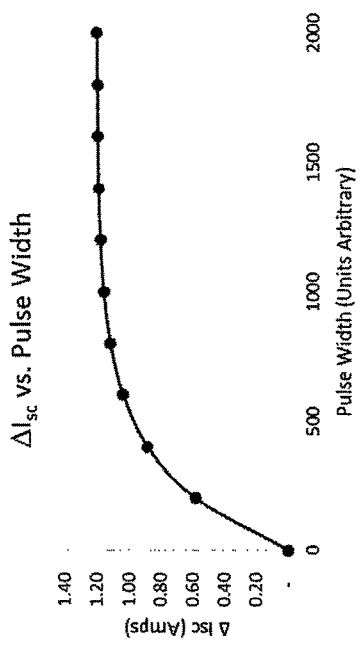

FIG. 11A shows the expected improvement in the short circuit current $I_{sc}$, for the solar panel 10 (shown in FIG. 2) as a function of the magnitude of the applied voltage pulse $V_{APP}$. As shown, the pulse width and the pulse repetition rate are fixed and the magnitude of the pulse voltage is varied from 50 to 250 volts. The improvement in the short circuit current $\Delta I_{SC}$ increases from nominally 0.1 to 2 Amps. The change in the short circuit current $\Delta I_{SC}$ as a function of the applied voltage pulse $V_{APP}$ is, to first order, approximately linear. FIG. 11B shows the change in the improvement of the short circuit current $\Delta I_{SC}$ as a function of the pulse repetition rate for a fixed pulse width and a fixed voltage pulse. As shown in FIG. 11B, the improvement in the short circuit current $\Delta I_{SC}$ decreases from approximately 1.7 amps to about 0.45 amps as the pulse repetition rate increases from 10 to 100 in arbitrary time units. This behavior is approximately exponential. FIG. 11C shows the change in the improvement of the short circuit current $\Delta I_{SC}$ as a function of the pulse width for a fixed pulse repetition rate and a fixed voltage pulse. For this example, the improvement of the short circuit current, $\Delta I_{SC}$ increases from 0 to 1.2 amperes as the pulse width increases from 0 to 2000 over time.

In each of the described embodiments, increasing the strength of the electric field 250 across the electrodes 101a, 101b of the solar cell 100 or solar panel 10 increases the efficiency of the solar cell 100 or panel 10, for example, up to a maximum electric field strength of $E_{max}$. Stated another way, once the strength of the electric field 250 reaches a maximum strength, the electron-hole recombination rate has been minimized. Accordingly, it can be advantageous to configure the control circuit of the photovoltaic device 200 to maximize the output current and voltage under varying operating conditions.

Figure 9A:
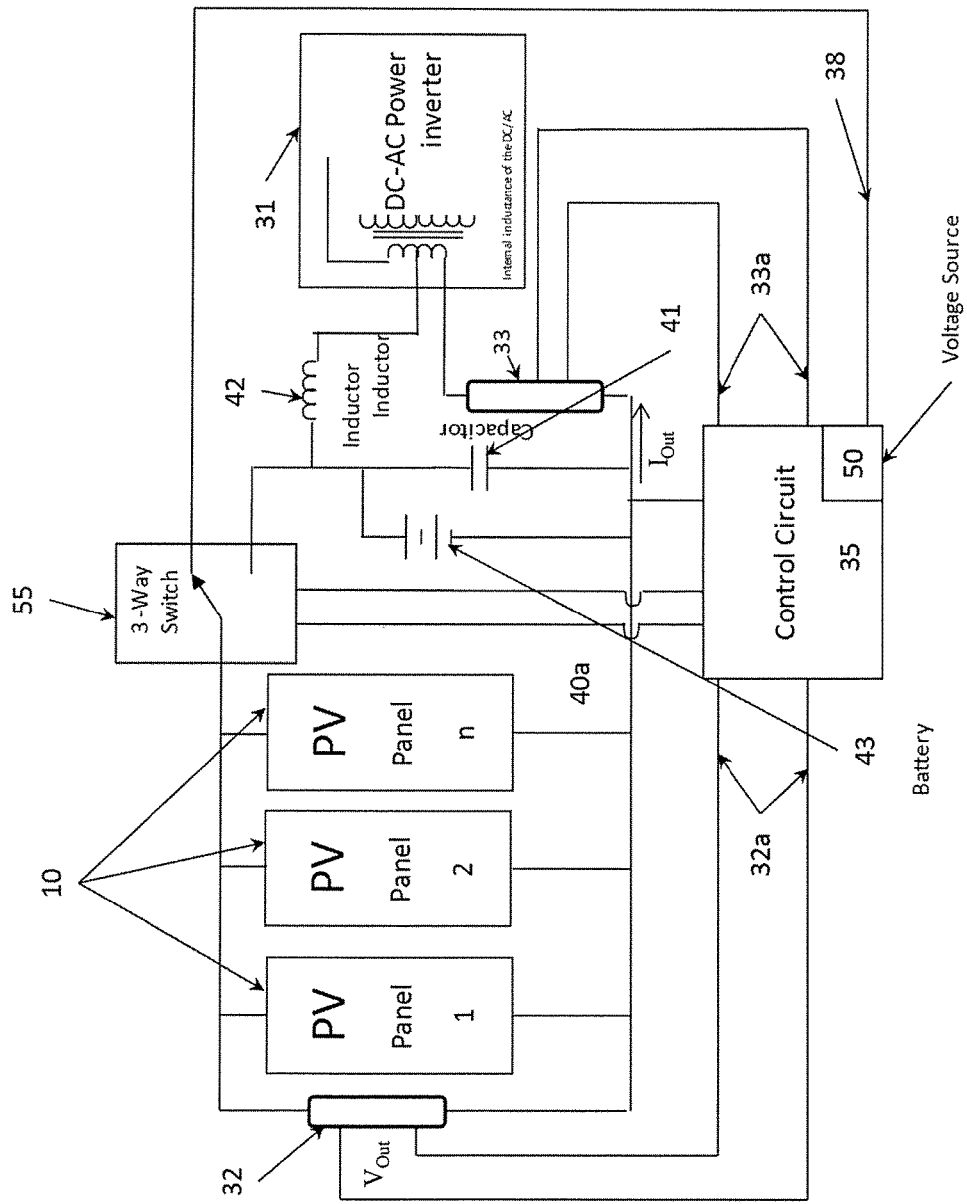
FIG. 9A is an exemplary block diagram illustrating an alternative embodiment of the solar cell management system of FIG. 4, wherein the solar cell management system includes a control circuit.

For example, turning to FIG. 9A, a current sensor 33 and a voltage probe 32 are shown coupled to the solar cell management system 300 of FIG. 4. As illustrated, the current sensor 33 is coupled in series between the solar panel 10 and the inverter 31. The current sensor 33 can monitor the current output of the solar panel 10. Similarly, the voltage probe 32 is connected across the solar panels 10 and the inverter 31 to monitor the output voltage of the solar panel 10.

A control circuit 35 is coupled to both of the current sensor 33 via control leads 33a and the voltage probe 32 via control leads 32a. The current sensor 33 can be an inline or inductive measuring unit and measures the current output of the solar panels 10. Similarly, the voltage sensor 32 is used to measure the voltage output of the solar panels 10. The product of the current measured from the current sensor 33 and the voltage measured from the voltage probe 32 is the power output from the solar panels 10 to the inverter 31.

In some embodiments, the voltage probe 32 may also serve as a power source for the control circuit 35 and is active only as long as the solar panels 10 are illuminated and provide sufficient power to activate control circuit 35. The control circuit 35 further is coupled to the switch 55 to determine switching times and frequency discussed with reference to FIG. 4. The duration of the switching times and the frequency can be controlled to apply the voltage $V_{App}$ across the solar panels 10 such that both the current generated within the solar cell 100 and measured by the current sensor 33 and voltage probe 32 are maximized under various operating conditions, such as under differing or variable lighting conditions.

In one embodiment for applying the electric field 250, the solar panel 10 initially does not generate power, for example, during the night or heavy cloud coverage. As the solar panels 10 are illuminated (for example, during the morning), voltage and current are generated by the solar panels 10, and the leads 32a begin to deliver both current and voltage to the control circuit 35. The control circuit 35 contains a low voltage logic power supply (not shown) to drive control logic within the control circuit 35. The control circuit 35 also includes the power source 50 for providing a high voltage power supply. The voltage source 50 has a variable output which can be adjusted by the control circuit 35 and is responsible for placing $V_{App}$ on a lead 38. The high voltage output $V_{App}$ from the control circuit 35 drives the lead 38 and is connected to the switch 55. The lead 38 is used to apply voltage $V_{App}$ through the switch 55 to the solar panels 10. In this example, the control circuit 35 is configured not to apply any voltage $V_{App}$ to the solar panels 10 until enough power is generated by the solar panels 10 to activate both the low voltage logic power supply and the high voltage power supply.

In an alternative embodiment, the control circuit 35 can be configured to apply the electric field 250 and maximize the power output as the illumination in the day increases and decreases. The control circuit 35 can provide the electric field 250 and stabilize the power output of the solar panels 10 according to any method described above, including process 9000 shown in FIG. 9B.

Figure 9B:
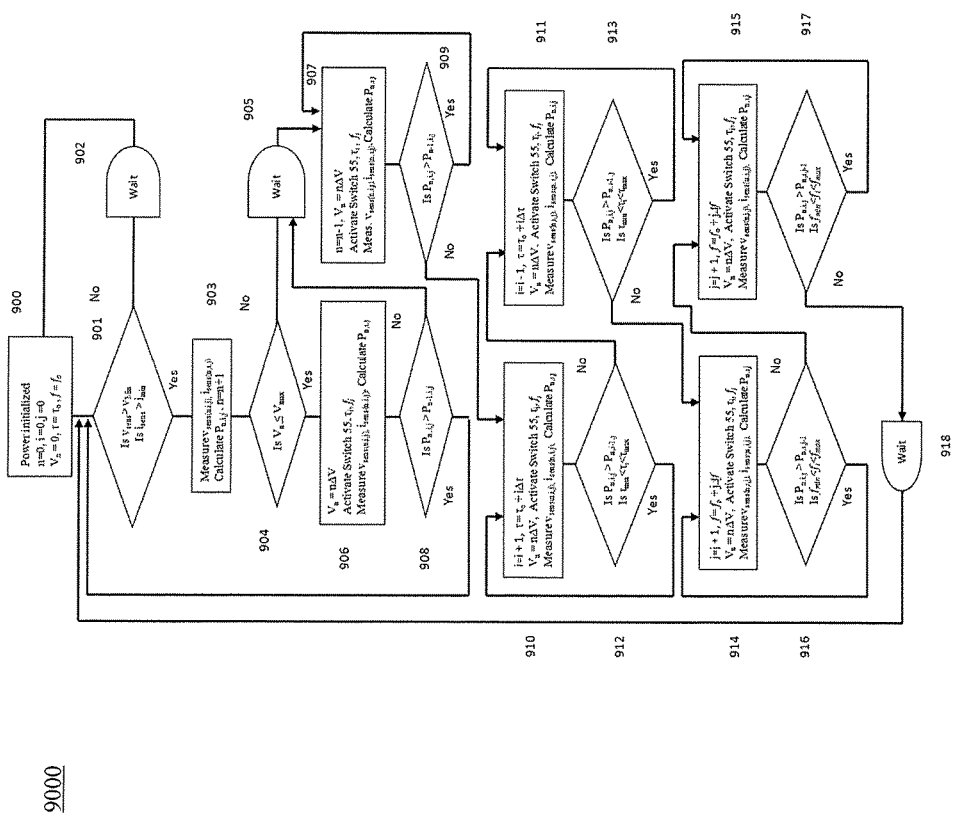
FIG. 9B is an exemplary flow-chart illustrating a state diagram for the control circuit shown in FIG. 9A.

Turning to FIG. 9B, the process 9000 includes initializing power, at step 900. Enough power must be present from the output of the solar panels 10 to activate both the low voltage logic power supply, which operates the control logic in control circuit 35, and the high voltage power supply necessary to place a high voltage on the lead 38 and through the switch 55. Alternatively, the control circuit 35 can be powered from an external source (not shown)—for example, a battery, a large capacitor, an external AC power supply—which allows the low voltage logic power supply to operate and the control circuit 35 to monitor the power output of the solar panels 10 until the solar panels 10 generate enough power output to warrant applying the electric field 250 on the solar panels 10 to augment their power output. Since the control circuit 35 is starting up, all of the parameters (e.g., the applied high voltage $V_{App}$, the switch duration time D, and the switching frequency f) are initialized. In one embodiment, the applied high voltage $V_{App}$ is set to zero while the switching duration D and the switching frequency f are set to nominal values of $D=\tau_o$ and $f=f_o$. All of the control indices, n, i, and j are initialized to zero.

The control circuit 35 then determines, at step 901, whether the voltage as measured on the voltage probe 32 is above or below a predetermined minimum $v_{min}$ and whether the current as measured on the current sensor 33 is above a predetermined minimum, $i_{min}$. The combination of $v_{min}$ and $i_{min}$ have been chosen such that the solar panels 10 are determined to be illuminated and generating some nominal percentage, for example, 5%, of their average rated power and that there is enough power being generated to supply the power source 50 within the control circuit 35 to augment the output of the solar panels 10. If the control circuit 35 determines that both the measured current and voltage are above the respective predetermined minimums, the control circuit 35 is now operational and process 9000 moves to step 903; otherwise, the process 9000 goes into a wait state, at step 902, and returns to step 900.

In step 903, the control circuit 35 measures the current flowing into the inverter 31 via the current sensor 33, the voltage across the inverter 31 via the voltage sensor 32, and calculates the power (nominally, current×voltage) flowing through the inverter 31. A control index n is incremented to n+1.

In step 904, the control circuit 35 compares $V_{App}$ with $V_{max}$. $V_{max}$ can be a preset value and represents the maximum voltage that can be placed on the solar panels 10 without damaging either the solar panels 10 or the inverter 31. Depending upon the type of the solar panel 10, $V_{max}$ is typically between 600 V and 1,000 V. If $V_{App}$ is less than $V_{max}$, then process 9000 proceeds to step 906; otherwise, process 9000 waits in step 905.

In step 906, the control circuit 35 increments the applied high voltage $V_{App}$ by an amount nΔV, and activates the switch 55. Activating the switch 55 disconnects the solar panels 10 from the inverter 31 and connects the solar panels 10 to $V_{App}$ from the control circuit 35 on leads 38. For this example, ΔV can be a fixed voltage step of 25 Volts although larger or smaller voltage steps can be used. The voltage $V_{App}$ imposes the electric field 250 on the solar panels 10 such that the strength of the electric field 250 is proportional to the applied voltage $V_{App}$. The duration of the connection of the solar panels 10 to $V_{App}$ within the control circuit 35 is chosen to not interrupt operation of the inverter 31. For this example, the duty cycle is chosen to be 5% (the solar panels 10 are connected 5% of the time to $V_{App}$ within the control circuit 35) and the default duration of the switching time is chosen to be nominally 1000 ns. Alternative switching times can be used as desired. The control circuit 35 again receives the measurement of the current flowing into the inverter 31 via the current sensor 33, receives the measurement of the voltage across the inverter 31 via the voltage sensor 32, and recalculates the power flowing through the inverter 31.

In step 908, the control circuit 35 compares the power output of the solar panels 10 before $V_{App}$ was placed on the solar panel 10 to the most recent measurement. If the power has increased, the process 9000 returns to step 901 and is repeated. The voltage applied on the lead 38 is increased by ΔV until either the applied high voltage $V_{App}$ is greater than $V_{max}$ or until the increase in the applied high voltage $V_{App}$ does not yield an increase in output power of the solar panels 10. $V_{max}$ is defined here as the maximum voltage that can be placed on a solar panel without causing it any damage. Depending upon the type of the solar panel 10, $V_{max}$ is typically approximately 600 to 1,000 V. In both cases, process 9000 waits in step 905. The duration of the wait state could be from seconds to minutes.

After the wait step 905, process 9000 continues to step 907. If the power, as measured through the leads 32a and 33a, has not changed, the index n is decremented (n=n−1), the applied voltage $V_{App}$ on the leads 38 to the solar panel(s) 10 is decreased by the amount ΔV, and the control circuit 35 activates the switch 55. Process 9000 continues in step 909 where the power output is measured by the current sensor 33 and voltage probe 32. If the power output shows a drop, process 9000 continues to step 910. If the power output has increased, the process 9000 returns to step 907 and the applied voltage $V_{App}$ continues to decrement until the power output of the solar panels 10 ceases to diminish. The process 9000 proceeds to step 910.

In step 910, the control circuit 35 increases the duration that the switch 55 is connected to the solar panels 10 on the lead 38 in the first position discussed above. The amount of time that the switch 55 is connected to the voltage source 50 is increased by an amount $i\Delta\tau_o$. The switch 55 is activated and the power output of the solar panels 10 is again monitored by the current sensor 33 and the voltage probe 34. The process 9000 proceeds to state 912 to determine whether the power output of the solar panels 10 increases. If so, process 9000 moves to step 910 and the duration that the solar panels 10 are connected to the voltage source 50 is increased again. The switching duration will increase until the output power of the solar panels 10 reaches a maximum (or until a fixed duration limit—for example, 3-5 μseconds is reached)—at which point the switch duration changes driven by the control circuit 35 stops. However, if at step 912, the control circuit 35 determines that increasing the switch duration D causes a decrease in the power output as measured by the current sensor 33 and the voltage probe 32, process 9000 continues to step 911 and the switch duration D is decreased by iterating between steps 911 and 913 until the power output of the solar panels 10 is maximized again. After the control circuit 35 has determined that the switching duration has been optimized for maximum output power of solar panels 10 by repeating step 910 to step 913, process 9000 continues to step 914.

In step 914, the control circuit 35 begins to increase the frequency of connection f at which the switch 55 is connected to the control circuit 35. The frequency f that the switch 55 is connected to the voltage source 50 is increased by jΔf from the original switching frequency $f_o$ such that $f=f_o+j\Delta f$. In step 914, the switch 55 is connected between the lead 38 and the solar panels 10 at a new frequency, f, and the power output of the solar panels 10 is again monitored by the current sensor 33 and the voltage probe 34. The process 9000 continues to step 916. If the power output of the solar panels 10 has increased, the process 9000 moves back to step 914 and the rate at which the solar panels 10 are connected to the voltage source 50 is increased again. The rate of connection will increase until the output power of the solar panels 10 reaches a maximum or until a maximum frequency $f_{max}$, at which point the process 9000 moves to step 915. In step 914, the frequency the switch 55 connects to the high voltage 50 on the lead 38 is now decremented by an amount jΔf and the switch 55 is activated again and the power output of the solar panels 10 is again monitored by the current sensor 33 and the voltage probe 32. At that point, the control circuit 35 decides whether the decrease in the rate of connection increases the power output of solar panels 10 in step 917. If so, the process 9000 returns to step 915. Alternatively, if the frequency of switching reaches some minimum frequency $f_{min}$, the process 9000 moves to step 918 to wait.

In step 918, once the power output of the solar panels 10 has been maximized, the control circuit 35 goes into a wait state for a period of time. The period of wait time can be seconds or minutes. After waiting in step 918, the process 9000 moves to step 901 where process 9000 again begins to vary the voltage, the switch connection time and the switching rate from the previous optimized values to validate the solar panels 10 are still operating at their maximum output levels. The applied voltage 50 from the control circuit 35, the switching duration, and the switching rate are all varied over the course of operation during a day to be sure that the solar panels 10 are operating under with maximum output power under the operational conditions of that particular day.

If at step 901, the voltage as measured on voltage sensor 32 drops below the predetermined minimum $v_{min}$, and the current as measured on current sensor 33 drops below a predetermined minimum $i_{min}$, the control circuit 35 will remove any voltage on lines 38, and the control circuit 35 will move to step 902 to wait before returning to step 900 (where the system will reinitialize all of the parameters and indices). Process 9000 will alternate from step 900 to 901 to 902 to 900 until both the voltage as measured on the voltage probe 32 and the current as measured on the current sensor 33 are both above $v_{min}$ and $i_{min}$ respectively, at which point the process 9000 will move from step 901 to step 903.

Different state machines within control circuit 35 can be implemented to yield similar results and are covered by this disclosure. However, the process 9000 described above advantageously minimizes the magnitude of the applied voltage $V_{App}$ to the lowest value possible such that the product of the current measured by the current probe 33 and the voltage measured by the voltage probe 32 are maximized. The applied voltage $V_{App}$ is dithered—that is changed by small amounts both up and down—over the course of operation in a day to account for changes the incident optical power, p, on the solar cell 100, the solar panel 10, or the plurality of solar panels 10 over the course of a day so that the maximum power output can always be maintained.

Most of the steps described in process 9000 above were designed to address adiabatic changes in illumination that occur slowly over periods of multiple minutes or hours. In an alternative embodiment, if the illumination variances were to occur at a higher rate of change, the process 9000 can be adapted to minimize the high frequency variations in DC power output to the inverter by attempting to hold the DC output power from varying at too high a rate of change, hence making the quality of the inverter higher.

Figure 10A:
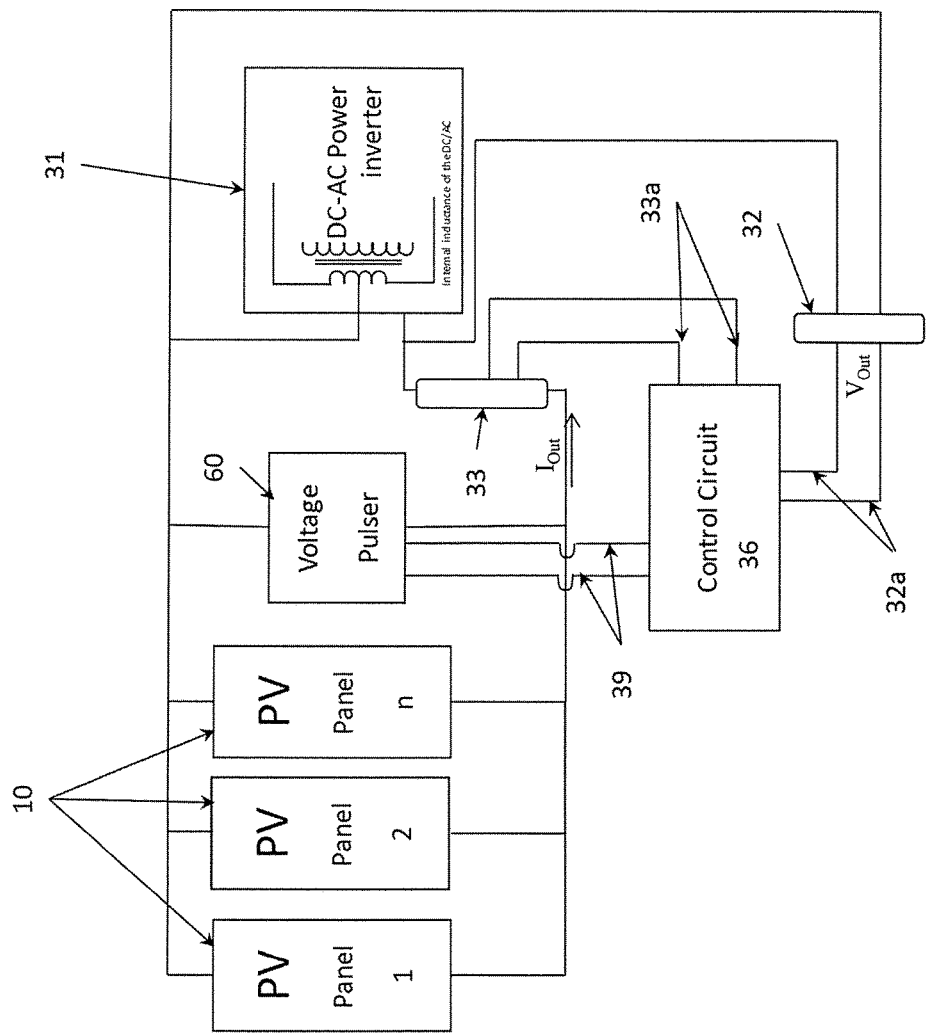
FIG. 10A is an exemplary block diagram illustrating an alternative embodiment of the solar cell management system of FIG. 6, wherein the solar cell management system includes a control circuit.

In another example, turning to FIG. 10A, the current sensor 33 and the voltage probe 32 are shown coupled to the solar cell management system 300 of FIG. 6. As illustrated, the current sensor 33 is coupled in series between the solar panel 10 and the inverter 31. The current sensor 33 can monitor the current output of the solar panel 10. Similarly, the voltage probe 32 is connected across the solar panels 10 and the inverter 31 to monitor the output voltage of the solar panel 10.

A control circuit 36 is coupled to both the current sensor 33 via control leads 33a and the voltage probe 32 via control leads 32a. The current sensor 33 can be an inline or inductive measuring unit and measures the current output of the solar panels 10. Similarly, the voltage sensor 32 is used to measure the voltage output of the solar panels 10. The product of the current measured from the current sensor 33 and the voltage measured from the voltage probe 32 allow for a calculation of the power output from the solar panels 10 to the inverter 31.

In some embodiments, the voltage probe 32 may also serve as a power source for the control circuit 36 and is active only as long as the solar panels 10 are illuminated and provide sufficient power to activate control circuit 36. The control circuit 36 further is coupled to voltage pulser 60 to control the amplitude of the voltage pulse $V_{App}$, the pulse duration $D_P$ and the pulse frequency f discussed with reference to FIG. 6. The pulse duration $D_P$, the pulse frequency f, and the pulse voltage $V_{App}$ applied across the solar panels 10 can be controlled and adjusted such that both the current generated within the solar panel 10 and measured by the current sensor 33 and voltage probe 32 are maximized under various operating conditions, such as under differing or variable lighting conditions.

In one embodiment for applying the electric field 250, the solar panel 10 initially does not generate power, for example, during the night or heavy cloud coverage. As the solar panels are illuminated (for example, during the morning), voltage and current are generated by the solar panels 10, and the leads 32a begin to deliver both current and voltage to the control circuit 36. The control circuit 36 contains a low voltage logic power supply (not shown) to drive control logic within the control circuit 36. The pulser circuit 60 contains both a low voltage and high voltage power supply (not shown). The high voltage power supply in voltage pulser 60 has a variable output which can be adjusted by control circuit 36 and is responsible for placing $V_{App}$ on solar panels 10. In this example, the control circuit 36 is configured not to apply any voltage to the solar panels 10 until enough power is being generated by the solar panels 10 to activate both the low voltage logic power supply and the high voltage power supply in pulser 60.

In an alternative embodiment, the control circuit 36 is configured to control the electric field 250 and maximize the power output as the illumination in the day increases and decreases. The control circuit 36 can control the electric field 250 applied by voltage pulser 60 and stabilize the power output of the solar panels 10 according to any method described above, including process 10000 shown in FIG. 10B.

Figure 10B:
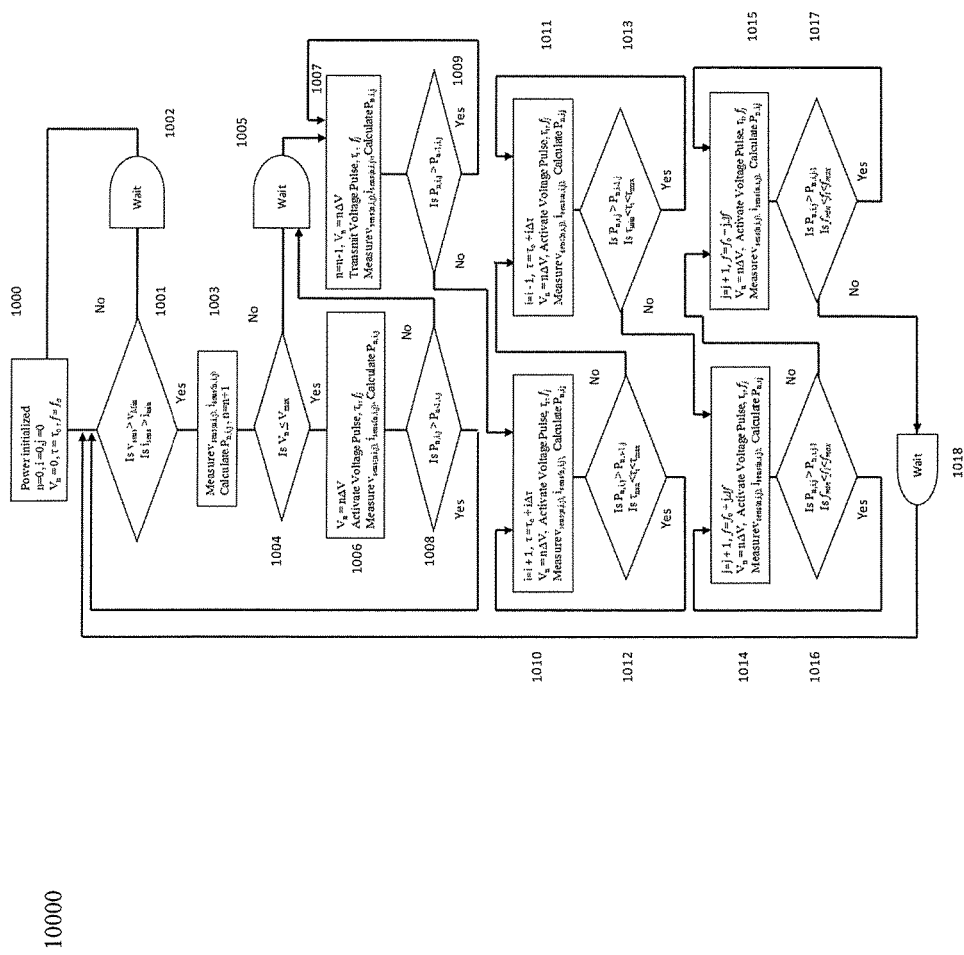
FIG. 10B is an exemplary flow-chart illustrating a state diagram for the control circuit shown in FIG. 10A.

Turning to FIG. 10B, the process 10000 includes initializing power, at step 1000. Enough power must be present from the output of the solar panels 10 to activate both the low voltage logic power supply, which operates the control logic in control circuit 36, and the low and high voltage power supply in voltage pulser 60. Alternatively, the control circuit 36 can be powered from an external source (not shown)—for example, a battery, a large capacitor, an external AC power supply—which allows the low voltage logic power supply to operate and the control circuit 36 to monitor the power output of the solar panels 10 until they have enough power output to warrant applying the electric field 250 on the solar panels 10 to augment their power output. Since the control circuit 36 is starting up, all of the parameters (e.g., applied high voltage $V_{App}$, the pulse duration $D_P$, and the pulse repetition frequency, j) are initialized. In one embodiment, the applied high voltage $V_{App}$ is set to zero while the pulse duration $D_P$ and pulse repetition rate f are set to nominal values of $D_P=\tau_o$ and $f=f_o$. All of the control indices, n, i, and j are initialized to zero.

The control circuit 36 then determines in step 1001 whether the voltage as measured on the voltage probe 32 is above or below a predetermined minimum $v_{min}$ and whether the current as measured on the current sensor 33 is above a predetermined minimum, $i_{min}$. The combination of $v_{min}$ and $i_{min}$ have been chosen such that the solar panels 10 are determined to be illuminated and generating some nominal percentage, for example, 5%, of their average rated power and that there is enough power being generated to supply the high voltage power supply to augment the output of the solar panels 10. If the control circuit 36 determines that both the measured current and voltage are above the respective predetermined minimums, then process 10000 is now operational and moves to step 1003; if not, process 10000 goes into a wait state 1002 and returns to step 1000.

In step 1003, the control circuit 36 measures the current flowing into the inverter 31 via the current sensor 33, the voltage across the inverter 31 via the voltage sensor 32, and calculates the power flowing through the inverter 31 (nominally, I×V). A control index n is incremented to n+1.

In step 1004, process 10000 compares $V_{App}$ with $V_{max}$. $V_{max}$ is a preset value and represents the maximum voltage that can be placed on the panels without damaging either the panels 10 or the inverter 31. If $V_{App}$ is less than $V_{max}$, then process 10000 proceeds to step 1006; otherwise, process 10000 waits in step 1005.

In step 1006, the control circuit 36 signals the voltage pulser 60 to increment the applied high voltage $V_{App}$ by an amount nΔV, and signals the voltage pulser 60 to apply the voltage pulse to the solar panels 10. For this example, ΔV can be a fixed voltage step of 25 Volts, although larger or smaller voltage steps can be used. The voltage $V_{App}$ imposes the electric field 250 on the solar panels 10 and the strength of the electric field 250 is proportional to the applied voltage $V_{App}$. For this example, the pulse width $D_P$ is chosen to be 1000 ns and the pulse repetition rate is chosen to be 20 μseconds. Other pulse widths and pulse repetition rates could also be chosen. The control circuit 36 again receives the measurement of the current flowing into the inverter 31 via the current sensor 33, receives the measurement of the voltage across the inverter 31 via the voltage sensor 32, and recalculates the power flowing through the inverter 31.

In step 1008, the control circuit 36 compares the power output of the solar panels 10 before $V_{App}$ was placed on the solar panel 10 to the most recent measurement. If the power has increased, process 10000 returns to step 1001 and is repeated. The applied voltage $V_{App}$ is increased by ΔV until either the applied high voltage $V_{App}$ is greater than $V_{max}$ or until the increase in the applied high voltage $V_{App}$ does not yield an increase in output power of the solar panels 10. Again, $V_{max}$ is defined here as the maximum voltage that can be placed on a solar panel 10 without causing it any damage and depending upon solar panel type, it would typically be approximately 600 to 1,000 V. In both cases, process 10000 waits in step 1005. The duration of the wait state could be from seconds to minutes.

After the wait step 1005, process 10000 enters step 1007. If the power, as measured through the leads 32a and 33a, has not changed, index n is decremented (n=n−1), the applied voltage pulse $V_{App}$ is decreased by the amount ΔV, and the control circuit 36 activates the pulser 60. Process 10000 continues in step 1009 where the power output as measured by the current sensor 33 and voltage probe 32. If the power output shows a drop, process 10000 continues to step 1010. If the power output has increased, process 10000 returns to step 1007 and the applied voltage $V_{App}$ continues to decrement until the power output of the solar panels 10 ceases to diminish. The process 10000 proceeds to step 1010.

In step 1010, the control circuit 36 begins to increase the duration $D_P$ of the voltage pulse. The voltage pulse duration $D_P$ is increased by an amount $i\Delta\tau_o$. The voltage pulser 60 is activated and the power output of the solar panels 10 is again monitored by the current sensor 33 and the voltage probe 34. The process 10000 proceeds to state 1012 to determine whether the power output of the solar panels 10 increases. If so, process 10000 moves to step 1010 and the duration $D_P$ of the voltage pulse 71 is increased again. The pulse duration $D_P$ will increase until the output power of the solar panels 10 reaches a maximum or until a fixed duration limit—for example, a pulse duration of 5 μseconds is reached—at which point the pulse width changes driven by the control circuit 36 stops. However, if at step 1012, it is found that the increasing the pulse width causes a decrease in the power output as measured by the current sensor 33 and the voltage probe 32, process 10000 continues to step 1011. The pulse width is decreased by iterating between steps 1011 and 1013 until the power output of the solar panels 10 is maximized again. After the control circuit 36 has determined that the pulse duration has been optimized for maximum output power of solar panels 10 by going through step 1010 to step 1013, the process continues to step 1014.

In step 1014, the control circuit 36 increases the frequency of the voltage pulses. The frequency of the voltage pulses is increased by jΔf from the original switching frequency $f_o$ such that $f=f_o+j\Delta f$. In step 1014, voltage pulses are applied by the voltage pulser 60 to the solar panels 10 at a new frequency f, and the power output of the solar panels 10 is again monitored by the current sensor 33 and the voltage probe 34. The process 10000 then moves to step 1016.

If the power output of the solar panels 10 has increased, the process 10000 moves back to step 1014 and the rate at which voltage pulses are applied to the solar panels 10 is increased again. The increase in the rate of voltage pulses will increase until the output power of the solar panels 10 reaches a maximum or until a maximum frequency $f_{max}$, at which point the process 10000 moves to step 1015. In step 1014, the frequency of the voltage pulses is now decremented by an amount jΔf and the voltage pulser 60 switch is activated again and the power output of the solar panels 10 is again monitored by the current sensor 33 and the voltage probe 32. At that point, the control circuit 36 determines whether the decrease in the rate of voltage pulses increases the power output of solar panels 10 in step 1017. If so, the process 10000 returns to step 1015. Alternatively, if the frequency of switching reaches some minimum frequency $f_{min}$, the process 10000 moves to step 1018, which is a wait state.

In step 1018, once the power output of the solar panels 10 has been maximized, process 10000 goes into a wait state for a period of time. The period of wait time can be seconds or minutes. After waiting in step 1018, the process 10000 moves to step 1001 where the control circuit 36 again begins to vary the pulse voltage, the pulse duration, and the pulse repetition rate from the previous optimized values to validate the solar panels 10 are still operating at their maximum output levels. The pulse amplitude $V_{App}$, the pulse duration, and the pulse repetition rate are all varied over the course of operation during a day to be sure that the solar panels 10 are operating under with maximum output power under the operational conditions of that particular day.

If at step 1001, the voltage as measured on the voltage sensor 32 drops below the predetermined minimum $v_{min}$, and the current as measured on current sensor 33 drops below a predetermined minimum $i_{min}$, the control circuit 36 will stop the voltage pulser 60 and the process 10000 will move to step 1002 wait state and then to step 1000 where the system will reinitialize all of the parameters and indices. The process 10000 will move from step 1000 to 1001 to 1002 to 1000 until both the voltage as measured on the voltage probe 32 and the current as measured on the current sensor 33 are both above $v_{min}$ and $i_{min}$ respectively, at which point process 10000 will move from step 1001 to step 1003.

Different state machines within the control circuit 36 can be implemented to yield similar results and are covered by this disclosure. However, the process 10000 described above advantageously minimizes the magnitude of the applied voltage pulse $V_{App}$ to the lowest value possible such that the product of the current measured by the current probe 33 and the voltage measured by the voltage probe 32 are maximized. The applied voltage pulse $V_{App}$ is dithered—that is changed by small amounts both up and down—over the course of operation in a day to account for changes the incident optical power, p, on the solar cell 100, the solar panel 10, or the plurality of solar panels 10 over the course of a day so that the maximum power output can always be maintained.

The steps described in process 10000 can address adiabatic changes in illumination that occur slowly over periods of multiple minutes or hours. In an alternative embodiment, if the illumination variances were to occur at a higher rate of change, the process 10000 can be adapted to minimize the high frequency variations in DC power output to the inverter by attempting to hold the DC output power from varying at too high a rate of change, hence making the quality of the inverter higher.

The described embodiments are susceptible to various modifications and alternative forms, and specific examples thereof have been shown by way of example in the drawings and are herein described in detail. It should be understood, however, that the described embodiments are not to be limited to the particular forms or methods disclosed, but to the contrary, the present disclosure is to cover all modifications, equivalents, and alternatives.

What is claimed is:

1. A method for increasing power output of a photovoltaic device, comprising:
    generating a first electric field across the photovoltaic device via application of a first series of voltage pulses with a positive magnitude; and
    suspending the application of the first series of voltage pulses.

2. The method of claim 1, further comprising generating a second electric field across the photovoltaic device via application of a second series of voltage pulses with a positive magnitude.

3. The method of claim 2, wherein said suspending the application of the first series of voltage pulses comprises suspending the application of the first series of voltage pulses between said generating the first electric field and said generating the second electric field.

4. The method of claim 1, wherein said suspending the application of the first series of voltage pulses comprises suspending the application of the first series of voltage pulses for a predetermined time interval.

5. The method of claim 4, wherein said suspending the application of the first series of voltage pulses comprises applying no potential to the photovoltaic device during the predetermined time interval.

6. The method of claim 1, wherein said generating the first electric field comprises applying the first series of voltage pulses via a voltage source coupled with the photovoltaic device, and wherein said suspending the application of the first series of voltage pulses comprises disabling the voltage source.

7. The method of claim 1, wherein said generating the first electric field comprises applying connecting a voltage source and the photovoltaic device in a first position of a switching system, and wherein said suspending the application of the first series of voltage pulses comprises disconnecting the voltage source and the photovoltaic device in a second position of the switching system.

8. The method of claim 1, further comprising adjusting the magnitude, a duration, or a frequency of the first series of voltage pulses to maximize the power output of the photovoltaic device.

9. The method of claim 8, wherein said adjusting the magnitude, the duration, or the frequency of the first series of voltage pulses includes monitoring an output voltage or an output current of the photovoltaic device and adjusting the magnitude, the duration, or the frequency of the first series of voltage pulses based upon said monitoring.

10. The method of claim 1, wherein said generating the first electric field includes applying the first series of voltage pulses across a plurality of photovoltaic devices.

11. The method of claim 1, wherein said generating the first electric field comprises generating the first electric field with a predetermined field direction.

12. The method of claim 11, wherein said generating the first electric field includes generating the first electric field with a first predetermined direction or a second predetermined direction, the first predetermined direction and a polarity of internal electrodes of the photovoltaic device being in a same direction for increasing the power output of the photovoltaic device, the second predetermined direction being in an opposite direction of the polarity of the internal electrodes for decreasing the power output of the photovoltaic device.

13. The method of claim 1, wherein said generating the first electric field increases the power output of the photovoltaic device by up to fifty percent under low light conditions.

14. The method of claim 1, wherein said generating the first electric field increases the power output of the photovoltaic device by more than fifty percent under low light conditions.

15. The method of claim 1, wherein said generating the first electric field increases the power output of the photovoltaic device by up to twenty percent under high intensity light conditions.

16. The method of claim 1, wherein said generating the first electric field increases the power output of the photovoltaic device between twenty percent and fifty percent.

17. The method of claim 1, wherein said generating the first electric field increases the power output of the photovoltaic device by more than fifty percent.

18. The method of claim 1, wherein said generating the first electric field increases the power output of the photovoltaic device based upon an intensity of light incident on the photovoltaic device, a thickness of the photovoltaic device, a pulse width of the first series of voltage pulses, or a frequency of the first series of voltage pulses.

19. The method of claim 1, further comprising configuring the photovoltaic device to drive a load.

20. The method of claim 19, further comprising converting a direct current voltage or current generated by the photovoltaic device into an alternating current voltage or current via the load.

21. The method of claim 20, wherein said converting the direct current voltage or current includes converting the direct current voltage or current via an inverter.

22. The method of claim 19, further comprising electrically isolating the photovoltaic device from the load in a radio frequency domain.

23. The method of claim 22, wherein said electrically isolating the photovoltaic device includes electrically isolating the photovoltaic device from the load via at least one inductor, at least one capacitor, at least one battery or a combination thereof.

24. The method of claim 1, wherein said generating the first electric field comprises applying the first series of voltage pulses to the photovoltaic device without structural modification of the photovoltaic device.

25. The method of claim 24, wherein said applying the first series of voltage pulses includes applying the first series of voltage pulses to the photovoltaic device via existing electrodes of the photovoltaic device.

26. A computer program product for increasing power output of a photovoltaic device, the computer program product being encoded on one or more non-transitory machine-readable storage media and comprising:
  instruction for generating a first electric field across the photovoltaic device via application of a first series of voltage pulses with a positive magnitude; and
  instruction for suspending the application of the first series of voltage pulses.

27. A system for increasing power output of a photovoltaic device, comprising:
  a voltage source for generating a first electric field across the photovoltaic device via application of a first series of voltage pulses with a positive magnitude; and
  said voltage source suspending the application of the first series of voltage pulses.

28. The system of claim 27, wherein said voltage source generates a second electric field across the photovoltaic device via application of a second series of voltage pulses with a positive magnitude.

29. The system of claim 28, wherein said voltage source suspends the application of the first series of voltage pulses between the application of the first electric field and the application of the second electric field.

30. The system of claim 27, wherein said voltage source suspends the application of the first series of voltage pulses for a predetermined time interval.

31. The system of claim 30, wherein said voltage source suspends applies no potential to the photovoltaic device during the predetermined time interval.

32. The system of claim 27, wherein said voltage source is enabled to apply the first series of voltage pulses and disabled to suspend the application of the first series of voltage pulses.

33. The system of claim 32, wherein said voltage source comprises a voltage pulser system.

34. The system of claim 27, further comprising a switching system for coupling said voltage source with the photovoltaic device, said switching system having a first position for providing a current path to apply the first series of voltage pulses to the photovoltaic device and a second position for isolating said voltage source from the photovoltaic device.

35. The system of claim 27, further comprising a control system for adjusting the magnitude, a duration, or a frequency of the first series of voltage pulses to maximize the power output of the photovoltaic device.

36. The system of claim 35, wherein said control system monitors an output voltage or current of the photovoltaic device and adjusts the magnitude, the duration, or the frequency of the first series of voltage pulses based upon the monitored output voltage or current.

37. The system of claim 27, wherein said voltage source applies the first series of voltage pulses across a solar cell, an array of solar cells, a solar panel, or an array of solar panels.

38. The system of claim 27, wherein said voltage source applies the first series of voltage pulses across a plurality of photovoltaic devices.

39. The system of claim 27, wherein said voltage source generates the first electric field with a predetermined field direction.

40. The system of claim 39, wherein said voltage source generates the first electric field with a first predetermined direction or a second predetermined direction, the first predetermined direction and a polarity of internal electrodes of the photovoltaic device being in a same direction for increasing the power output of the photovoltaic device, the second predetermined direction being in an opposite direction of the polarity of the internal electrodes for decreasing the power output of the photovoltaic device.

41. The system of claim 27, wherein generation of the first electric field increases the power output of the photovoltaic device by up to fifty percent under low light conditions.

42. The system of claim 27, wherein generation of the first electric field increases the power output of the photovoltaic device by more than fifty percent under low light conditions.

43. The system of claim 27, wherein generation of the first electric field increases the power output of the photovoltaic device by up to twenty percent under high intensity light conditions.

44. The system of claim 27, wherein generation of the first electric field increases the power output of the photovoltaic device between twenty percent and fifty percent.

45. The system of claim 27, wherein generation of the first electric field increases the power output of the photovoltaic device by more than fifty percent.

46. The system of claim 27, wherein generation of the first electric field increases the power output of the photovoltaic device based upon an intensity of light incident on the photovoltaic device, a thickness of the photovoltaic device, a pulse width of the first series of voltage pulses, or a frequency of the first series of voltage pulses.

47. The system of claim 27, further comprising a load being driven by the photovoltaic device.

48. The system of claim 47, wherein said load is configured to convert a direct current voltage or current generated by the photovoltaic device into an alternating current voltage or current.

49. The system of claim 48, wherein said load comprises an inverter.

50. The system of claim 47, wherein the photovoltaic device is electrically isolated from said load in a radio frequency domain.

51. The system of claim 50, wherein the photovoltaic device is electrically isolated from said load via at least one inductor, at least one capacitor, at least one battery or a combination thereof.

52. The system of claim 27, wherein said voltage source applies the first series of voltage pulses to the photovoltaic device without structural modification of the photovoltaic device.

53. The system of claim 52, wherein said voltage source applies the first series of voltage pulses to the photovoltaic device via existing electrodes of the photovoltaic device.

* * * * *